(12) United States Patent
Asano et al.

(10) Patent No.: US 7,554,147 B2
(45) Date of Patent: Jun. 30, 2009

(54) MEMORY DEVICE AND MANUFACTURING METHOD THEREOF

(75) Inventors: Isamu Asano, Tokyo (JP); Tsuyoshi Kawagoe, Tokyo (JP); Kiyoshi Nakai, Tokyo (JP); Yukio Fuji, Tokyo (JP); Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 126 days.

(21) Appl. No.: 11/374,074

(22) Filed: Mar. 14, 2006

(65) Prior Publication Data

US 2006/0211231 A1 Sep. 21, 2006

(30) Foreign Application Priority Data

Mar. 15, 2005 (JP) .............................. 2005-072469
Feb. 14, 2006 (JP) .............................. 2006-037090

(51) Int. Cl.
*H01L 27/108* (2006.01)
(52) U.S. Cl. ...................................... 257/296
(58) Field of Classification Search ................ 438/593; 365/148

See application file for complete search history.

(56) References Cited

U.S. PATENT DOCUMENTS

2005/0185444 A1* 8/2005 Yang et al. .................. 365/148
2006/0148135 A1* 7/2006 Matsuoka et al. ........... 438/127

FOREIGN PATENT DOCUMENTS

JP 2003-91463 A 3/2003
JP 2003-229537 A 8/2003

* cited by examiner

*Primary Examiner*—Kimberly D Nguyen
*Assistant Examiner*—Tony Tran
(74) *Attorney, Agent, or Firm*—McDermott Will & Emery LLP

(57) ABSTRACT

A memory device in which both DRAM and phase-change memory (PCRAM) are mounted is provided with a DRAM bit line, a PCRAM bit line or a PCRAM source line formed on an conductive layer shared with the DRAM bit line, and a sense amplifier connected between the DRAM bit line and the PCRAM bit line. The memory device further has a capacitive element disposed on the upper layer of the DRAM bit line, and a phase-change element disposed on the upper layer of the PCRAM bit line. The lower electrode of the capacitive element and the lower electrode of the phase-change memory element are formed on the shared conductive layer.

4 Claims, 24 Drawing Sheets

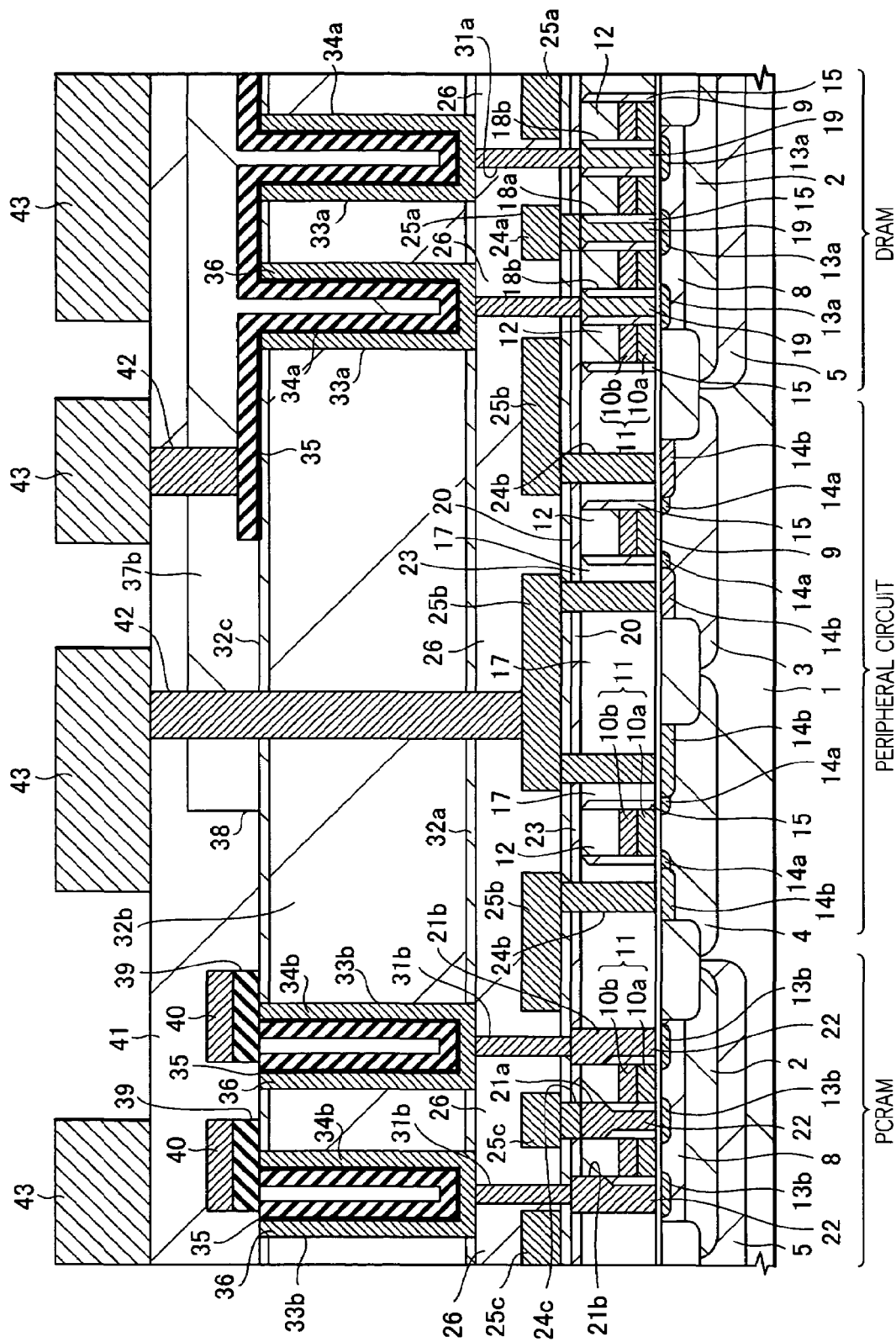

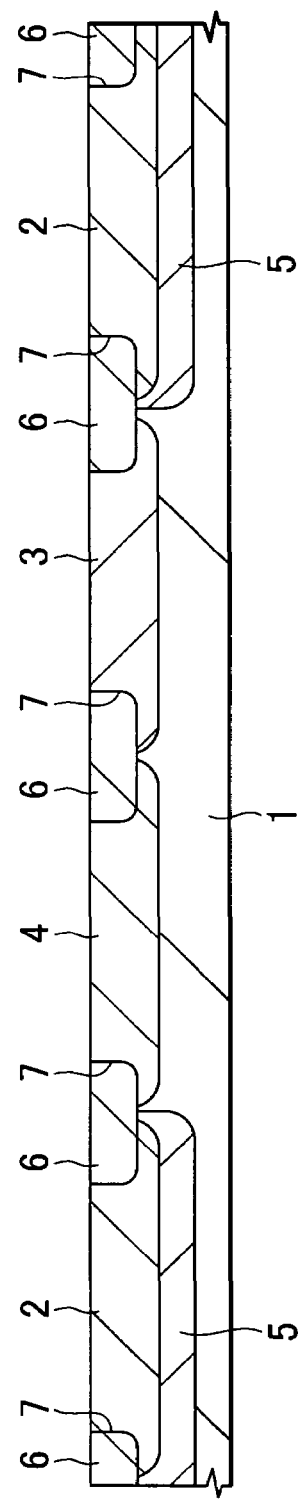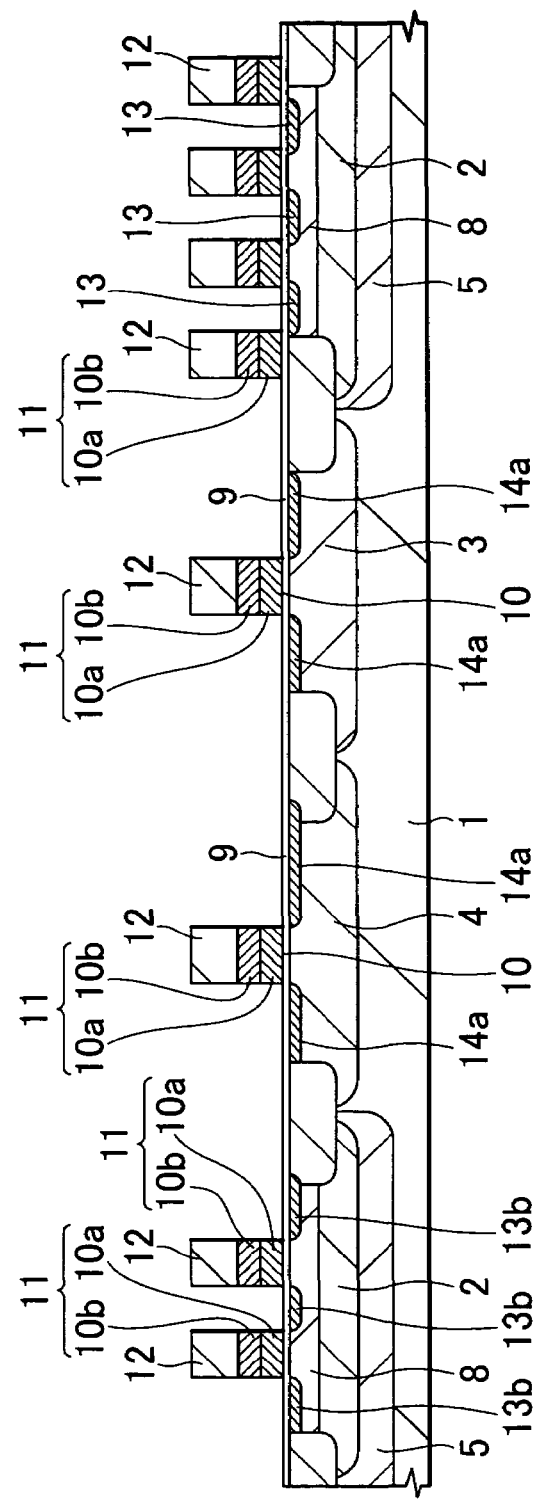
FIG. 4A
FIG. 4B

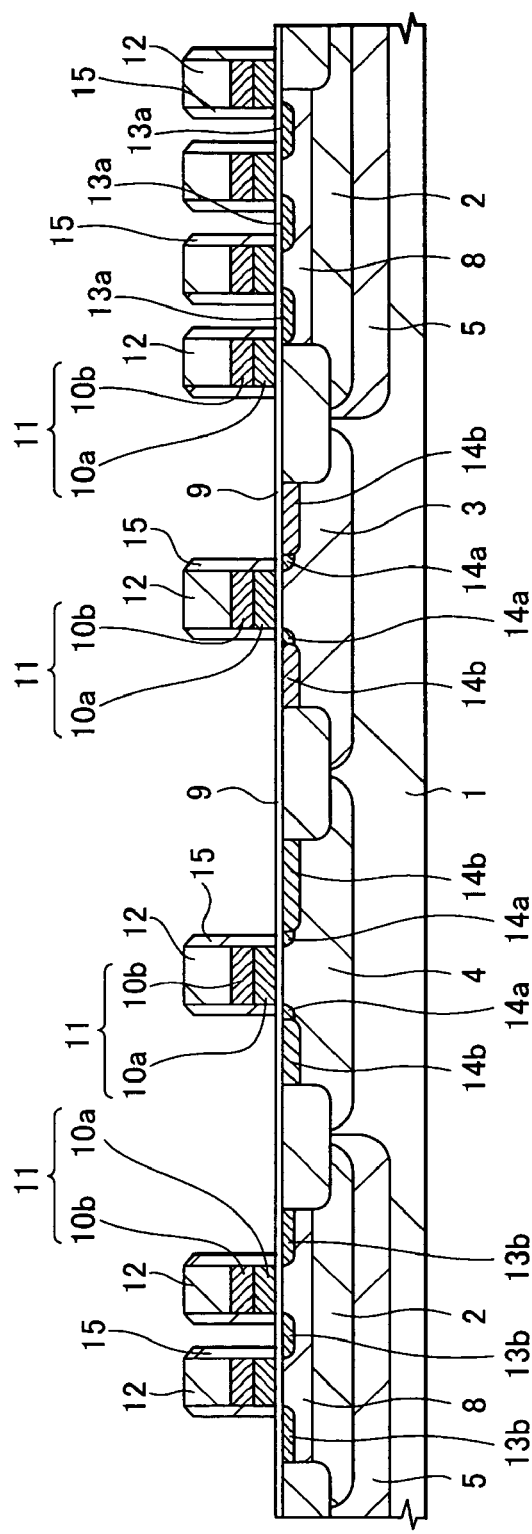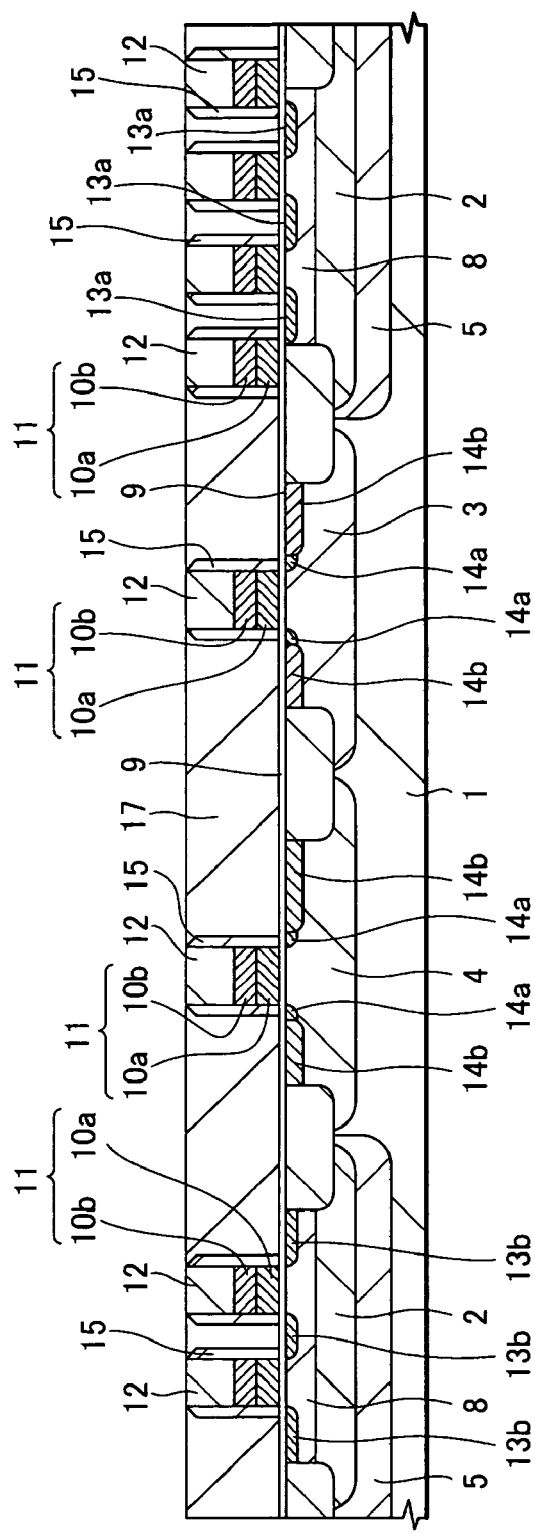
FIG. 5A
FIG. 5B

MEMORY DEVICE AND MANUFACTURING METHOD THEREOF

TECHNICAL FIELD

The present invention relates to a memory device and a method for manufacturing a memory device, and more specifically relates to a structure of a memory device in which both DRAM and PCRAM are mounted, and to a method for manufacturing this memory device.

BACKGROUND OF THE INVENTION

DRAM is memory with excellent cell area, access speed, and rewrite endurance, but the data is volatile and there are considerable limitations in the use of the data. Various nonvolatile memory that may replace DRAM have been proposed in prior art. However, there is no known memory that surpasses DRAM performance with respect to cell area, access speed, and rewrite endurance, as shown in TABLE 1 below.

TABLE 1

|  | DRAM | FLASH | OUM | MJT-RAM | FeRAM |
|---|---|---|---|---|---|
| Volatility | Volatile | Non-vol. | Non-vol. | Non-vol. | Non-vol. |
| Cell area | 6-12 $\mu m^2$ | 7-11 $\mu m^2$ | 5-8 $\mu m^2$ | — | Large |
| Write time | 50 ns | 1 $\mu s$ | 10 ns | 30 ns | 80 ns |
| Erase time | 50 ns | ~100 ms | 50 ns | 30 ns | 80 ns |
| Read time | 50 ns | 60 ns | 20 ns | 30 ns | 80 ns |
| Rewrite endurance | ∞ | 1E6 | >1E12 | >1E12 | >1E12 |
| Read endurance | ∞ | ∞ | ∞ | >1E12 | >1E12 |

Described in Japanese Patent Application Laid Open No. 2003-91463 is a memory device in which SDRAM with high operational speed is mounted together with nonvolatile flash memory. With the memory device described in the publication, write data sent from the host device to the memory device is temporarily stored in SDRAM and thereafter transferred from SDRAM to flash memory when a store command is received from the host device or when power is switched off. The data transferred to flash memory is transferred to SDRAM when power is switch on, and the host device writes and reads data at high speed to and from the SDRAM.

Described in Japanese Patent Application Laid Open No. 2003-229537 is a phase-change RAM (PCRAM) in which a phase-change memory cell is used. The PCRAM described in the publication is receiving much attention very recently because it has advantages in that the footprint of the memory cell is small and the access speed is high. Since DRAM (which is volatile memory) loses data when power is switched OFF, it is effective to dually mount nonvolatile memory to compensate for this drawback. However, there is a drawback when both DRAM and flash memory or other nonvolatile memory are mounted as described in the above publications in that the circuit configuration for transferring data between the two mounted memories is made more complex due to the differences in data structure between the two memories, and the access speed (write and erase speed) of flash memory decreases.

When, for example, both DRAM and MJT-RAM or FeRAM are mounted in structures in which DRAM is mounted together with a nonvolatile memory other than flash memory, the complexity of the cell structure and the cell area increases, and there are other problems. Thus, the mounting of both DRAM and nonvolatile memory proposed in the prior art makes it difficult to select nonvolatile memory that would provide a consolidated chip architecture that has excellent compatibility with DRAM. In view of the above, the combined mounting of PCRAM and DRAM described in Japanese Patent Application Laid Open No. 2003-229537 is under consideration. However, when both the PCRAM and DRAM are mounted, a considerable number of points must be considered regarding the circuit configuration, structure, and other aspects.

In view of the problems of the above-described prior art, an object of the present invention is to provide a memory device and a method for manufacturing a memory device that make it possible to configure a consolidated chip that uses PCRAM, which is nonvolatile memory with excellent compatibility with DRAM, does not increase the complexity of the circuitry, restrains the increase in footprint size, and increases the access speed.

SUMMARY OF THE INVENTION

In order to achieve the above-stated object, the memory device according to one aspect of the present invention is a memory device on which both a DRAM and a phase-change memory (PCRAM) are mounted and which has a DRAM bit line, a PCRAM bit line or a PCRAM source line formed on an conductive layer shared with the DRAM bit line, and a sense amplifier connected between the DRAM bit line and the PCRAM bit line.

The memory device according to another aspect of the present invention is provided with a DRAM array area and a PCRAM array area, wherein the DRAM array area has a cell capacitor having a capacitive lower electrode, a capacitive insulation film, and a capacitive upper electrode, and further has a DRAM select transistor connected to the capacitive lower electrode of the cell capacitor; the PCRAM array area has a capacitor structure comprising a capacitive lower electrode, a capacitive insulation film, and a capacitive upper electrode, and further has a phase-change element and a PCRAM select transistor that are mutually connected via the capacitive lower electrode of the capacitor structure; and the cell capacitor and the capacitor structure are formed on the same layer.

The method for manufacturing a memory device according to another aspect of the present invention is a method for manufacturing a memory device in which both DRAM and phase-change memory (PCRAM) are mounted, the method having a step for forming a DRAM bit line and a PCRAM bit line or a PCRAM source line on a shared conductive layer, and a step for connecting the DRAM bit line and the PCRAM bit line via a sense amplifier.

The method for manufacturing a memory device according to another aspect of the present invention is a method for manufacturing a memory device in which both DRAM and phase-change memory (PCRAM) are mounted, the method having a transistor layer formation step for forming in substantially the same step a transistor layer on both the DRAM array area and PCRAM array area; a capacitive layer formation step for forming in substantially the same step a capacitive layer that is the upper layer of the transistor layer and has a structure in which a capacitive lower electrode, a capacitive insulation film, and a capacitive upper electrode are sequentially laminated on both the DRAM array area and the PCRAM array area; a step for maintaining a phase-change material formation area wherein the capacitive upper electrode is partially removed in at least the PCRAM array area;

and a phase-change material formation step for forming a phase-change material in the area in which at least the capacitive upper electrode has been removed.

BRIEF DESCRIPTION OF THE DRAWINGS

The above and other objects, features and advantages of the present invention will become more apparent by reference to the following detailed description of the invention taken in conjunction with the accompanying drawings, wherein:

FIG. 3 is a partial cross-sectional view showing the main components of the memory device 100;

FIG. 4A is a partial cross-sectional view showing the main components of the memory device 100 of the first embodiment of the present invention;

FIG. 4B is a partial cross-sectional view showing the main components of the memory device 100 of the first embodiment of the present invention;

FIG. 5A is a partial cross-sectional view showing the main components of the memory device 100 of the first embodiment of the present invention;

FIG. 5B is a partial cross-sectional view showing the main components of the memory device 100 of the first embodiment of the present invention;

DETAILED DESCRIPTION OF THE EMBODIMENTS

The memory device of the present invention is a consolidated chip with DRAM and PC (Phase Change) RAM, which is superior in terms of compatibility with DRAM processes and which is nonvolatile memory most proximate to DRAM in terms of cell area and access speed. The memory device according to the present invention ordinarily operates as DRAM, but information can be retained when power is off by periodically transferring data to PCRAM, which is nonvolatile memory. When a command to write data to the PCRAM is sent, the data is not immediately written to the PCRAM, but is temporarily written to the DRAM and then later written to the PCRAM, thereby compensating for the drawback of a PCRAM alone, which has a limited write endurance (up to 1E12 times).

The circuit configuration in the memory device is one in which a bit line and a sense amplifier are shared between the DRAM and PCRAM. The circuit configuration can thereby be simplified, and a consolidated chip with a small area can be achieved with fewer process steps. From the aspect of device structure, a capacitor having substantially the same structure is fabricated for both the DRAM and PCRAM, the capacitor is used as a cell capacitor in the DRAM area, and the capacitor lower electrode is used as the lower electrode of the PCRAM in the PCRAM area. The manufacturing step of the DRAM cell and the PCRAM cell can thereby be shared.

Figure 1:
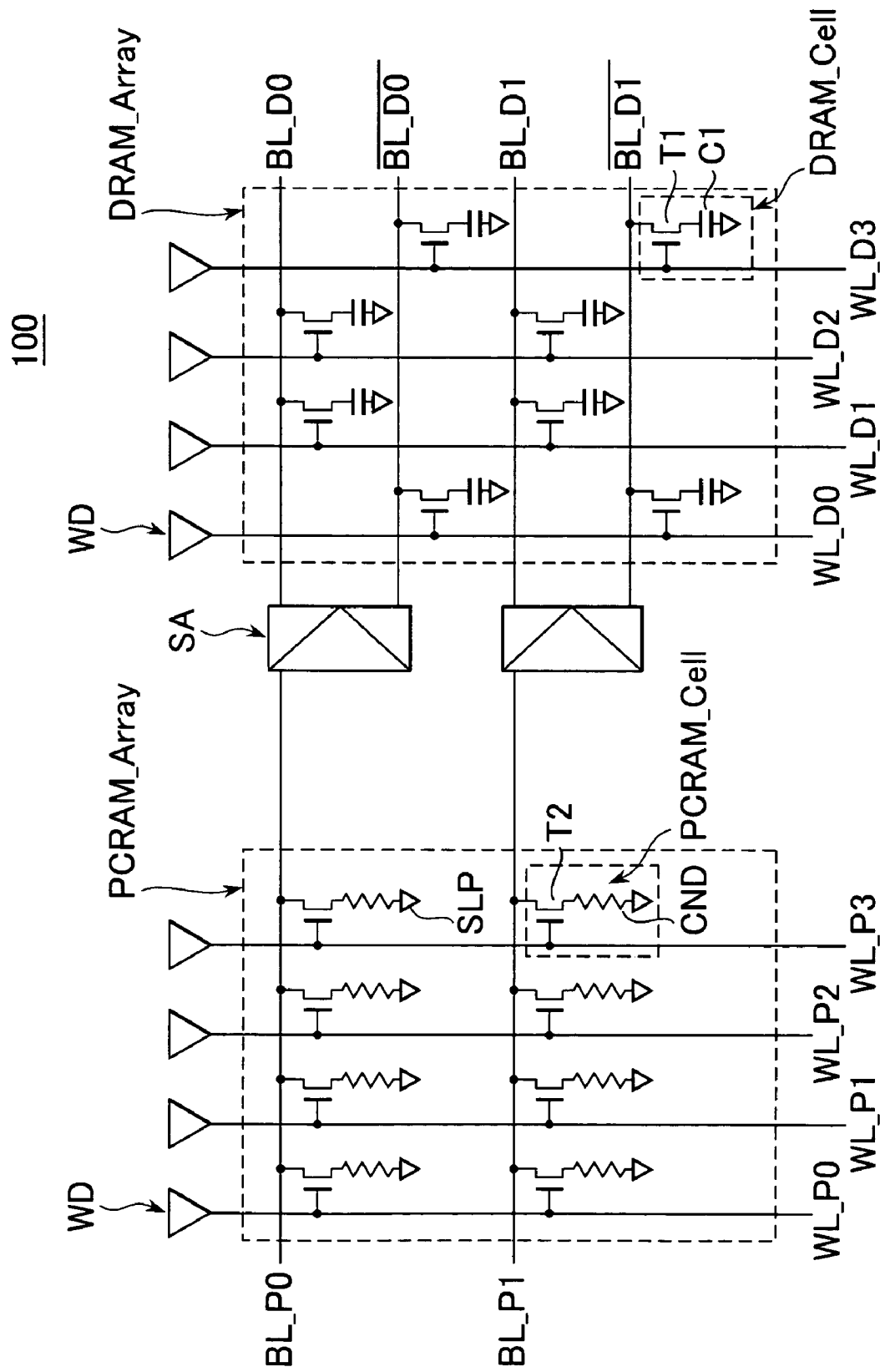
FIG. 1 is an equivalent circuit diagram showing the configuration of the main components of the memory device 100 related to the first embodiment of the present invention.

FIG. 1 is an equivalent circuit diagram showing the configuration of the main components of the memory device 100 related to the first embodiment of the present invention, and shows the wiring configuration of a sense amplifiers SA and bit lines BL. The DRAM memory array (DRAM_Array) has a plurality of word lines WL_D (WL_D0, WL_D1, WL_D2, WL_D3) disposed in the form of a matrix, a plurality of bit lines BL_D (BL_D0, BL_D0, BL_D1, BL_D1), and a plurality of memory cells (DRAM_Cell) disposed at the intersections of the word lines and bit lines. A single memory cell for storing a single bit of information has a single capacitor C1, and a single select transistor (MISFET) T1 that is connected in series to the capacitor. The source of the select transistor T1 is electrically connected to the capacitor C1, and the drain is electrically connected to the bit line BL_D. One end of the word lines WL_D is connected to a word driver WD, and one end of the bit lines BL_D is connected to a sense amplifier SA.

The memory array of the PCRAM (PCRAM_Array) similarly has a plurality of word lines WL_P (WL_P0, WL_P1, WL_P2, WL_P3) disposed in the form of a matrix, a plurality of bit lines BL_P (BL_P0, BL_P1), and a plurality of memory cells (PCRAM_Cell) disposed at the intersections of the word lines and bit lines. A single memory cell of the PCRAM has a single chalcogenide element (phase-change element) CND and a single select transistor (MISFET) T2 that is connected in series to the element. The source of the select transistor T2 is electrically connected to one end of the chalcogenide element CND, and the drain is electrically connected to the bit line BL_P. The bit lines BL_P of the PCRAM are connected to the sense amplifiers SA, and the sense amplifiers SA are shared with the DRAM array. One end of the word lines WL_P of the PCRAM are connected to a word driver WD. In the first embodiment, electric current flows from the source lines SLP to the bit lines BL_P.

In the present embodiment, data is transferred between the DRAM memory cell connected to a pair of complimentary bit lines BL_D0 and BL_D0, which are themselves connected to the sense amplifier SA, and the PCRAM memory cell connected to a single bit line BL_P0 that is connected to the sense amplifier SA. When data is transferred from the DRAM to the PCRAM, for example, the word lines WL_D of the DRAM and the corresponding word lines WL_P of the PCRAM are simultaneously activated. At this time, the sense amplifier SA connects to the DRAM side by using an internal switch (not shown), and disconnects from the PCRAM side by using an internal switch (not shown). A signal from the DRAM memory cell is amplified in the sense amplifier SA, and data is written to the memory cell on the PCRAM side by using a write transistor inside the sense amplifier SA.

The above-described write operation is performed as follows. The PCRAM is a device that holds data by controlling two states: a high-resistance Reset state (the phase-change element is in an amorphous state) and a low-resistance Set state (the phase-change element is in a crystallized state) In order to allow the phase-change element to transition between the Reset and Set states, separately required electric currents must be allowed to flow to the phase-change element for a fixed length of time to cause heating. A large electric current must generally be allowed to flow for a short length of time to create a Reset state, and in order to create a Set state a smaller electric current than that for setting a Reset state must be allowed to flow for a long period of time. For this reason, the time and magnitude of the write electric current that corresponds to the write data must be separately controlled. Although not shown, a first driver element for feeding Set current to the phase-change element and a second driver element for feeding Reset current are each provided in order to carry out this control, and the signals of the pair of complimentary bit lines of the DRAM are used as the drive signals of the driver elements. The desired electric current can be allowed to flow to the phase-change element by operating only one of driver elements by using the data signals of the pair of complimentary bit lines.

The write time is controlled by opening for a required length of time the write transistor (not shown) gate disposed inside the sense amplifier SA. Such a configuration allows the required amount of electric current to flow to the memory cells of the PCRAM for the required length of time in accordance with the transfer data. When the data recorded in the memory cells of the DRAM are transferred to the corresponding memory cells of the PCRAM in this manner, batch transfer in word line units is made possible.

Figure 2B:
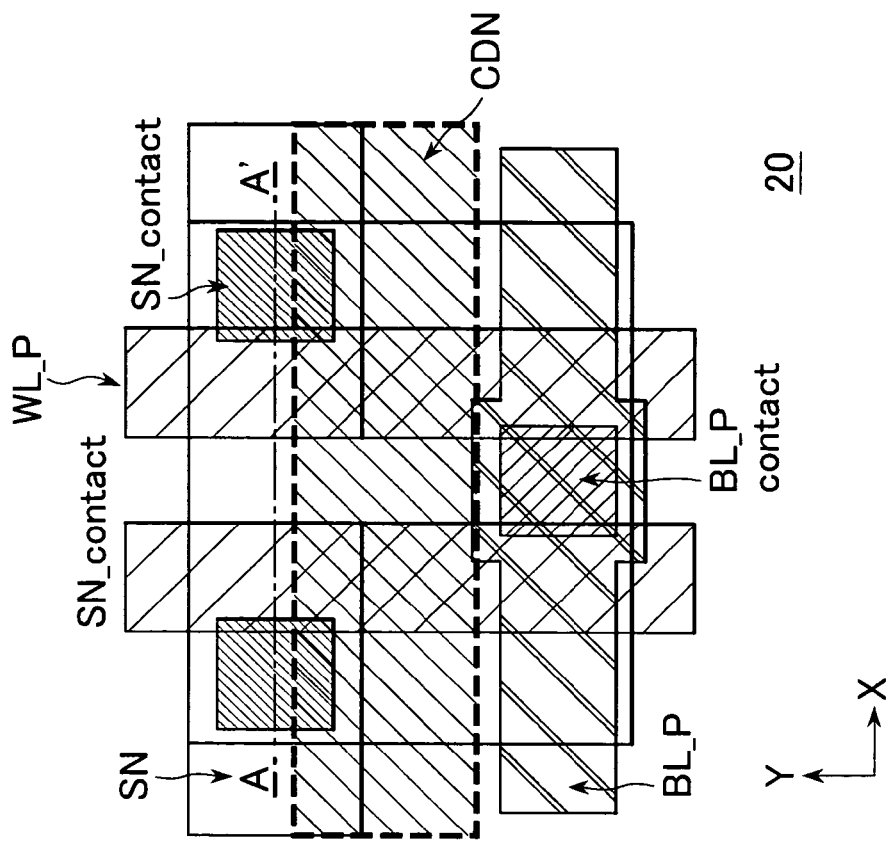
FIG. 2B is an enlarged plan view of a portion of the DRAM array (DRAM_Array) of FIG. 1.
Figure 2A:
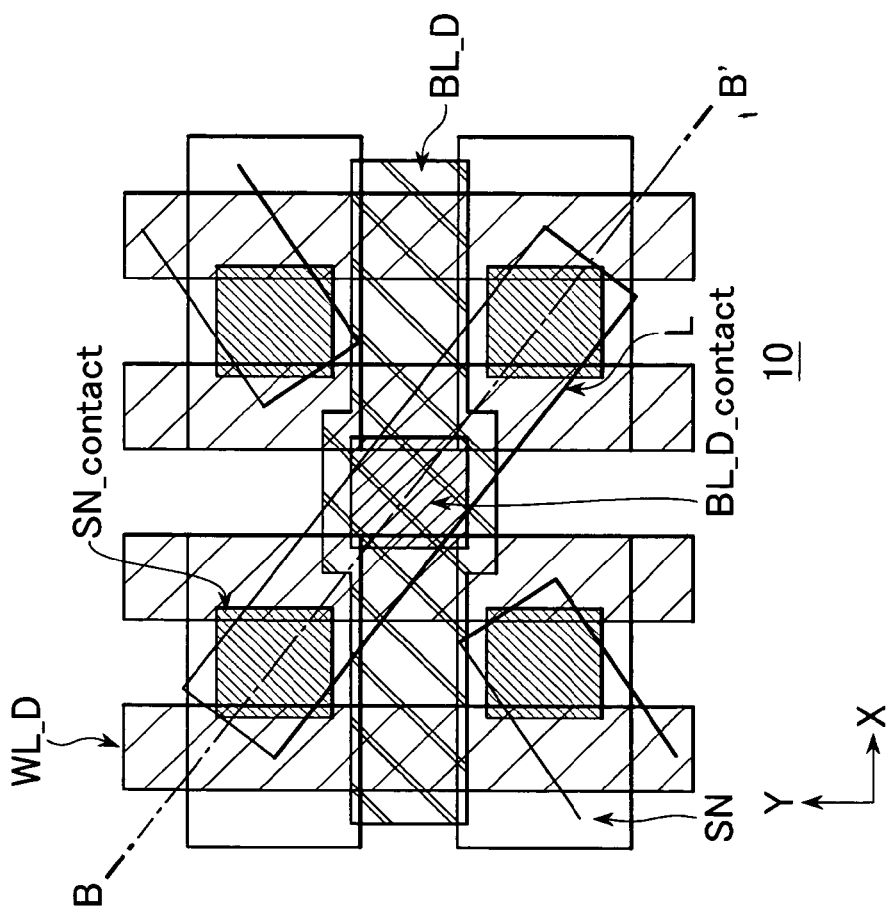
FIG. 2A is an enlarged plan view of a portion of the PCRAM array (PCRAM_Array) of FIG. 1.

FIG. 2A is an enlarged plan view of a portion of the PCRAM array (PCRAM_Array) of FIG. 1. The plan view of FIG. 2A and the plan view of FIG. 2B described below show the shape of patterns for configuring the members and do not represent the shapes of actual members. In other words, the depicted patterns are drawn in square or rectangular shapes, but actual members are formed with round or obtuse vertices. In the PCRAM array, the word lines WL_P extend in the Y direction and the bit lines BL_P extend in the X direction. A chalcogenide element GST is disposed in the vicinity of the area in which the word lines WL_P and bit lines BL_P overlap. The chalcogenide element GST is described in detail hereinbelow and is one in which a phase-change material (chalcogenide material) is laminated on the metal electrodes of the upper and lower layers. The lower electrode is connected to the select MOSFET (word lines WL_P) and to the bit lines BL_P via the select transistor T2. The lower electrode uses the same pattern as the capacitive lower electrode of the DRAM array described next. Other cross-sectional structure diagrams of the first embodiment shown in the drawings below are cross sections along the line A_A' of FIG. 2A of the PCRAM array.

FIG. 2B is an enlarged plan view of a portion of the DRAM array (DRAM_Array) of FIG. 1. An active area L is disposed in the DRAM array, the word lines WL_D are disposed in the Y direction, and the bit lines BL_D are disposed in the X direction. In the area in which the word lines WL_D and the active area L overlap, the word lines WL_D function as gate electrodes of the select transistor T2. A connection hole BL_D_contact for connecting to the bit lines BL_D is formed in the center portion of the active area L sandwiched between the areas that function as gate electrodes of the word lines WL_D, and the active area L and bit lines BL_D are electrically connected via the connection hole BL_D_contact. The areas at both ends of the active area L are connected to a capacitive lower electrode SN via the capacitive contact SN_contact. Other cross-sectional structure diagrams of the first embodiment shown in the drawings below are cross sections along the line B_B' of FIG. 2B of the DRAM array.

FIG. 3 partial cross-sectional view showing the main components of the memory device 100 of the present embodiment, where the cross section of the memory cell of the PCRAM is shown on the left hand side of the diagram, and the cross section of the memory cell of the DRAM is shown on the right hand side. The cross sections are cross sections along the lines A-A' and B-B' shown in FIGS. 2A and 2B. The portion arranged between the two is a peripheral circuit area, and this portion representatively shows the shared sense amplifier SA.

The method for manufacturing the memory device of the first embodiment of the present invention is described below with reference to FIG. 4 and thereafter. First, an element separation area 6 is formed on the main surface of a semiconductor substrate 1 that is composed of single crystal p-silicon having a resistance of 10 Ωcm, for example, as shown in FIG. 4A. The element separation area 6 is formed by forming shallow grooves 7 in the main surface of the semiconductor substrate 1 and embedding a silicon oxide layer. For example, the shallow grooves 7 may have a depth of 0.3 μm, and a silicon oxide film may be formed on the inside walls by thermal oxidation. The silicon oxide film is deposited on the entire surface, after which the surface is polished by CMP (Chemical Mechanical Polishing) to leave only the silicon oxide film inside the shallow grooves 7, thus forming an element separation area 6. The pattern of the active area L encompassed by the element separation area 6 is a linear flat pattern, as shown in FIGS. 2A and 2B.

A photoresist is subsequently used as a mask, and phosphorus (P) ions are injected to form a deep n well 5. Another next photoresist is used as a mask, and phosphorus (P) ions are then injected to form an n well 4. Yet another photoresist is used as a mask, and boron (B) ions are then injected to form p wells 2 and 3.

Next, a gate insulation film 9 is formed by thermal oxidation in the active area in which the p wells 2 and 3 and the n well 4 were formed, as shown in FIG. 4B, and boron (B) ions are injected and a threshold voltage adjustment layer 8 is formed in the DRAM memory cell area with the aim of adjusting the threshold voltage of the select transistor T1.

A polysilicon film 10a in which phosphorus (P) is introduced as an impurity at a concentration of $3 \times 10^{12}$ atoms/cm$^3$ is subsequently deposited to a thickness of 50 nm on the entire surface of the semiconductor substrate 1, and a tungsten film 10b is then deposited to a thickness of 100 nm, for example. Although not depicted in the diagrams, a tungsten nitride (WN) film, for example, is inserted at this time at the interface between the tungsten film 10b and polysilicon film 10a with the aim of preventing a reaction between the two. The polysilicon film 10a may be formed by CVD (Chemical Vapor Deposition), and the tungsten film 10b and tungsten nitride film may be formed by sputtering.

A silicon nitride film 12 is thereafter deposited to a thickness of 200 nm, for example. The laminated films are then patterned using photolithography and dry etching, and gate electrodes (word lines WL_D, WL_P) 11 and a cap insulation layer 12 are formed. The pattern of the word lines at this time are shown in FIGS. 2A and 2B. The word lines for both the DRAM and PCRAM are linearly patterned, and the process can be easily carried out at the limit of the photolithography process.

The PCRAM array area is constructed in the same manner as the DRAM array area, and the word lines 11 in the PCRAM array area are formed by the same process as the word lines in the DRAM array area. Preferably formed in the PCRAM array area in particular is a shallow and highly concentrated semiconductor area 13b for the purpose of assuring the electric current of select transistor T2 as well as reducing the contact resistance of the memory cell contact of the PCRAM_lower electrode and the contact resistance of the bit line contact of the PCRAM_memory cell described hereinbelow.

Next, the cap insulation film 12 and gate electrodes are masked using a photoresist (not shown), and arsenic (As) or phosphorus (P) ions, for example, are injected as impurities in the area in which the n-channel MISFET of the peripheral circuit area and the DRAM memory cell area are formed, forming a low-concentration impurity area 14a of the n-channel MISFET and a semiconductor area 13. Boron (B) ions are then injected as impurities, for example, in the area in which the p-channel transistor of the peripheral circuit area is formed, and a low-concentration impurity area 14a of the p-channel transistor is formed.

A silicon nitride film 15 is then deposited to a thickness of 30 nm, for example, on the entire surface of the semiconductor substrate 1. The silicon nitride film 15 is thereafter subjected to anisotropic dry etching, leaving the remainder on the side walls of the gate electrodes and the cap insulation film 12. Next, a photoresist film is formed on the DRAM memory cell area and on the area in which the n-channel MISFETQn of the peripheral circuit area is to be formed; boron (B) ions, for example, are injected as impurities with the photoresist film and silicon nitride film 15 acting as a mask; and a high-concentration impurity area 14b of the p-channel MISFETQp is formed. A photoresist film is formed on the DRAM memory cell area and on the area in which the p-channel MISFETQp of the peripheral circuit area is to be formed, the photoresist film and the silicon nitride film 15 are used as a mask, phosphorus (P) ions are injected as impurities, and the high-concentration impurity area 14b of the n-channel MISFETQn is formed (FIG. 5A).

Next, a silicon oxide film is formed to a thickness of 400 nm by CVD, for example, as shown in FIG. 5B, and the surface of the film is polished and smoothed by CMP (Chemical Mechanical Polishing) to form an insulation film 17. The silicon oxide film (hereinafter referred to as TEOS oxide film) formed at this time by CVD, in which TEOS (Tetra Methoxy Silane) is used as the raw material gas, may be used as the silicon oxide film, for example. When the deposition is carried out, prescribed amounts of boron (B) and phosphorus (P) are introduced into the silicon oxide film, and the silicon oxide film may then be reflowed by applying heat. The smoothness may thereafter be enhanced by jointly using CMP to form the insulation film 17.

Figure 6A:
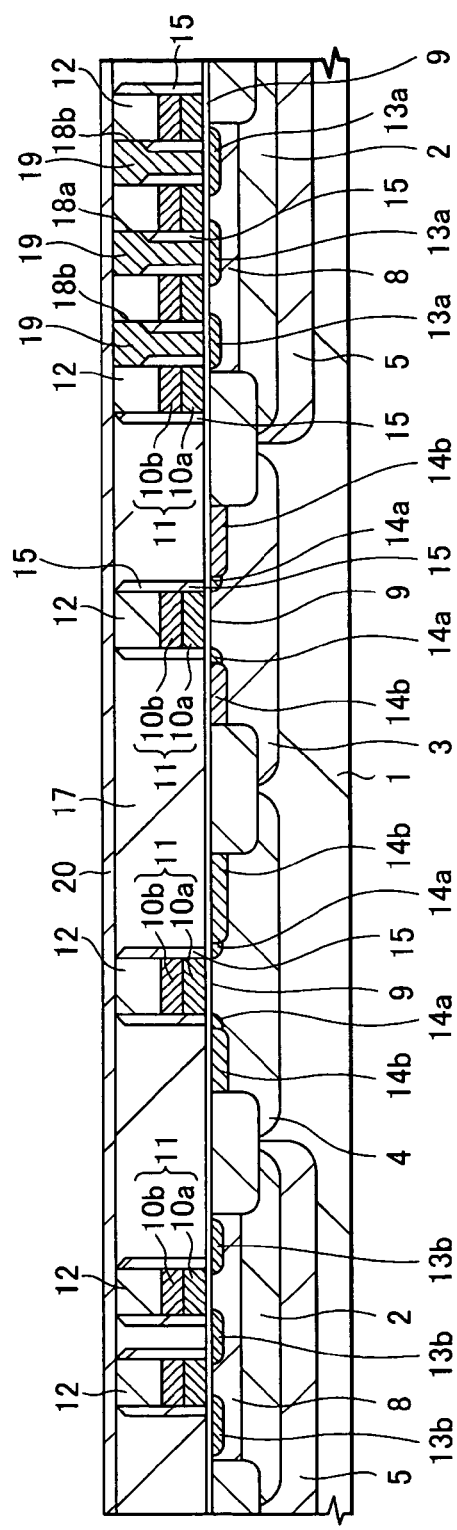
FIG. 6A is a partial cross-sectional view showing the main components of the memory device 100 of the first embodiment of the present invention.

Memory cell contacts 18 (18a and 18b) of the DRAM array area are then opened using photolithography and dry etching, as shown in FIG. 6A. The bit line BL_D_contact in FIG. 2B corresponds to the memory cell contact 18a in FIG. 6A, and the capacitive contact SN_contact in FIG. 2B corresponds to the memory cell contact 18b in FIG. 6A. This dry etching is conducted so as to utilize the difference in etching speeds between the silicon insulation film and the silicon nitride film, and to impede the etching of the silicon nitride film 15 that covers the side walls of the gate electrode, achieving self-alignment with the gate electrode. A polysilicon film is formed in which $2 \times 10^{20}$ atoms/cm$^3$ of phosphorus (P), for example, are introduced into the opened memory cell contact 18, and a plug 19 is then formed by CMP-based polishing, for example.

An insulation film 20 is then formed on the entire surface of the semiconductor substrate 1. The TEOS oxide film described above is formed to a thickness of 50 nm, for example, on the surface of the insulation film 20 (shown in FIG. 6A)

Figure 6B:
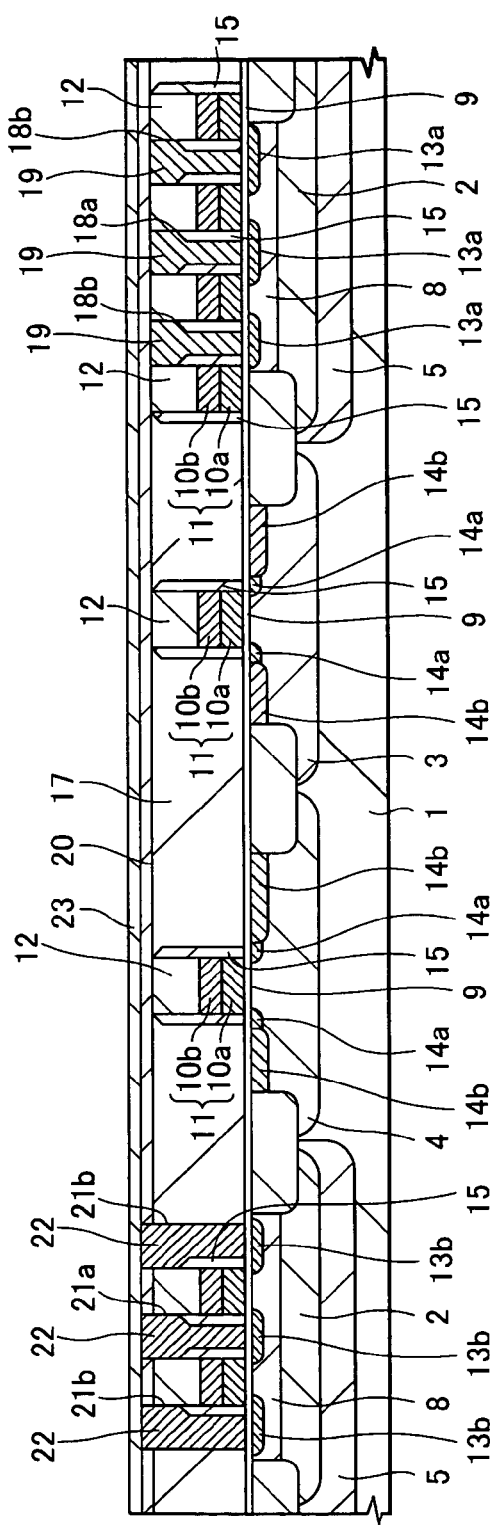
FIG. 6B is a partial cross-sectional view showing the main components of the memory device 100 of the first embodiment of the present invention.

Next, in the PCRAM array area, memory contacts 21 (21a and 21b) are opened by using photolithography and dry etching, as shown in FIG. 6B). The bit line BL_P_contact in FIG. 2A corresponds to the memory cell contact 21a in FIG. 6B, and the capacitive contact SN_contact in FIG. 2A corresponds to the memory cell contact 21b. This dry etching is conducted so as to utilize the difference in etching speeds between the silicon insulation film and the silicon nitride film, and to impede the etching of the silicon nitride film 15 that covers the side walls of the gate electrode, achieving self-alignment with the gate electrode. A tungsten film, may be formed, for example, by CVD in the memory cell contact 21 thus opened, and a plug 22 may then be formed by CMP-based polishing.

Figure 7:
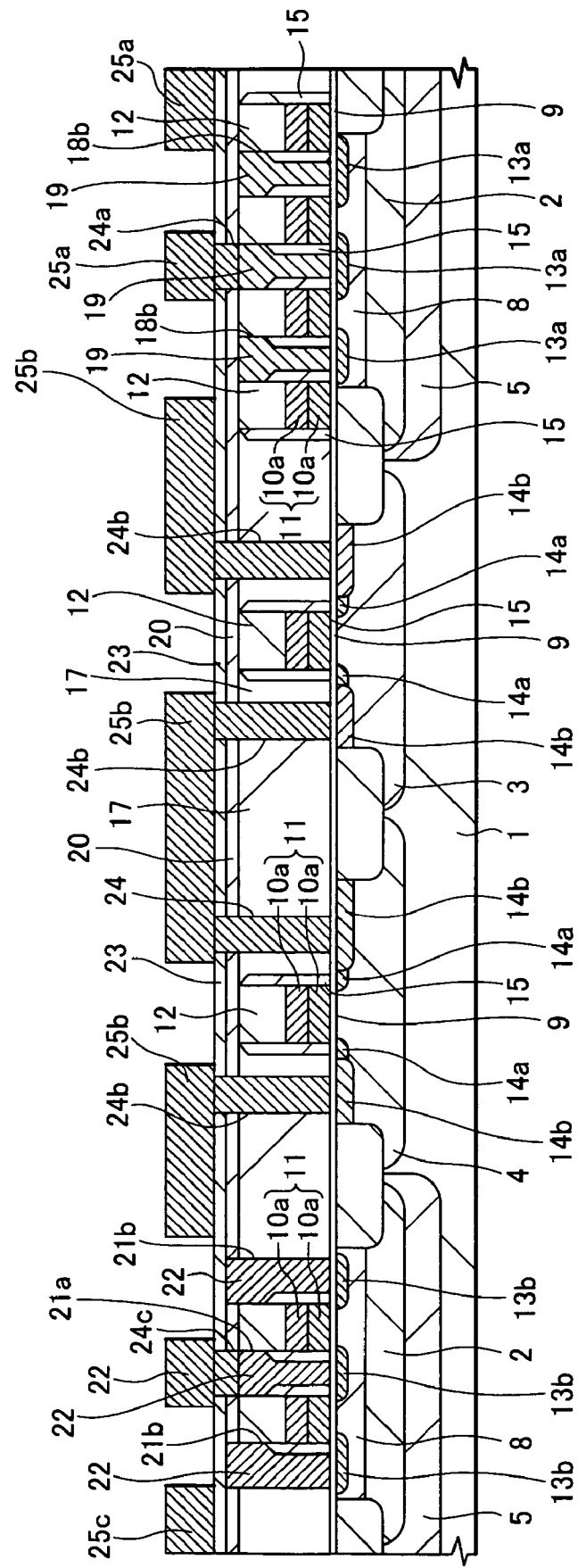
FIG. 7 is a partial cross-sectional view showing the main components of the memory device 100 of the first embodiment of the present invention.

Next, a bit line 25 shared by the PCRAM and DRAM is formed, as shown in FIG. 7. Dry etching is first performed using a photoresist as a mask to form a connection hole 24c for forming a connection with the memory cell plug 22 formed in the memory cell contact 21a of the PCRAM array area, a connection hole 24a for forming a connection with a polysilicon plug 19 formed in the memory cell contact 18a of the DRAM array area, and a connection hole 24b for forming a connection with the high-concentration impurity area 14b formed in the semiconductor substrate 1 of the peripheral circuit area. At this time, since the depth and undercoating material to be opened are different, the three connection holes 24a, 24b, and 24c described above may be formed by combining photolithography and dry etching in order to minimize excessive etching of the undercoating material by over etching.

Next, in order to form the bit line 25, a tungsten film, for example, is deposited on the entire surface of the semiconductor substrate 1 to a thickness of twice or more of the diameter of the connection holes 24 (24a to 24c) by CVD. The connection holes 24 are thereby covered by the tungsten film, and the embedded tungsten film forms a metal plug. A desired bit line is then patterned by photolithography and dry etching. The wiring represents the bit lines 25a and 25c in the DRAM array area and PCRAM array area, and the local wiring 25b in the peripheral circuit area.

Here, a cobalt (Co), titanium (Ti), tantalum (Ta), tungsten (W), or other silicide film is preferably formed prior to the formation of the bit line 25 in order to assure good electrical conductivity with the undercoating elements with which the metal plugs make contact, that is to say, with the polysilicon plug 19 in the DRAM array area and with the high-concentration impurity area 14b. The latter is the source and drain areas of the MISFET in the peripheral circuit area.

When there is a difference between the metal film thickness required to embed the connection holes 24 and the film thickness required for the bit line 25, the plug portion may be first embedded in the connection holes 24, and the bit line portion is then formed. In such a case, the metal material of the bit line may be different than the material of the metal plug that fills the through holes 24. When, for example, tungsten is selected as the metal material of the bit line, a copper film or another metal film may be used as the metal plug material that fills the through holes 24. However, considering the reduction in reliability due to thermal diffusion of the metal atoms into the semiconductor substrate 1, the metal plug material is preferably a high melting metal. Examples thereof include molybdenum (Mo), tantalum (Ta), and niobium (Nb).

In this manner, the bit line 25a of the DRAM array area and the bit line 25c of the PCRAM array area are simultaneously formed on the same conductive layer.

Figure 8:
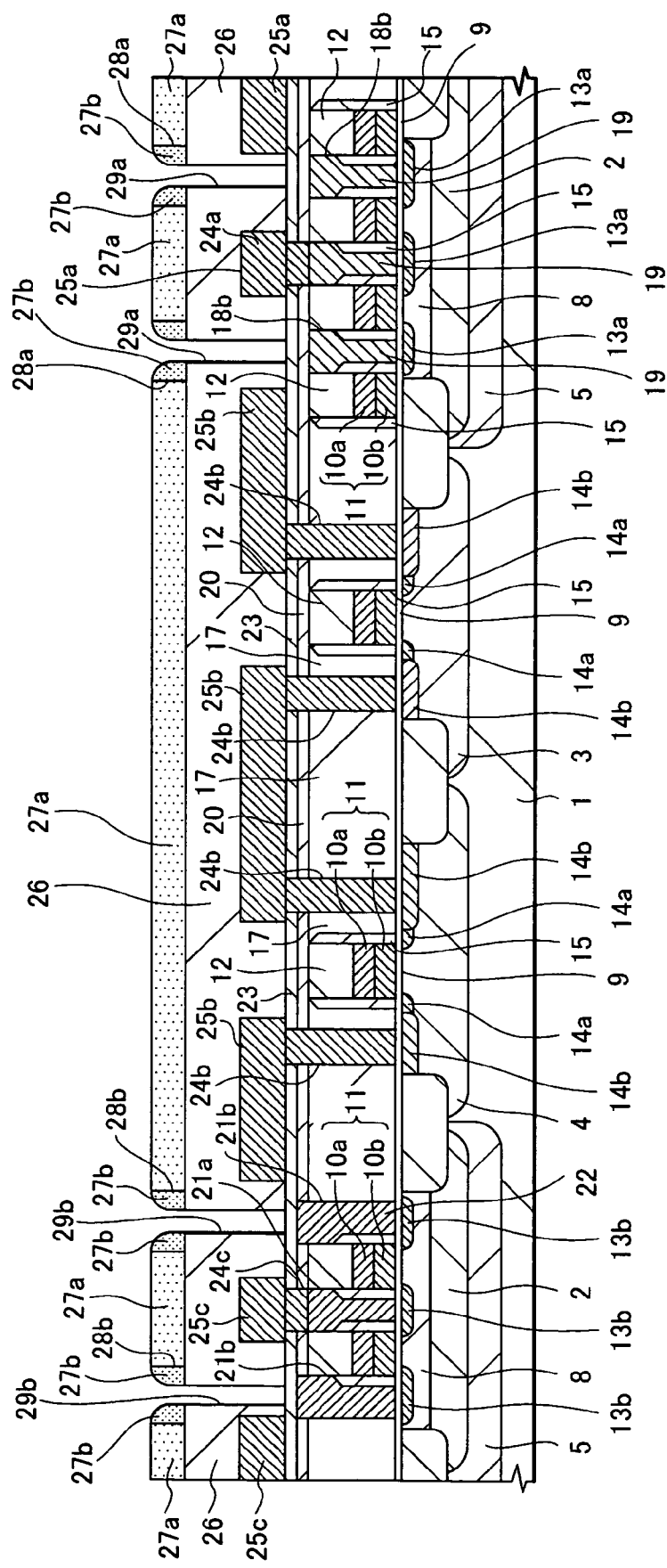
FIG. 8 is a partial cross-sectional view showing the main components of the memory device 100 of the first embodiment of the present invention.

Next, an insulation film 26 is formed on the upper layer of the bit line 25, as shown in FIG. 8. A plasma TEOS oxide film, for example, can be used as the insulation film 26, and the film thickness may be 500 nm.

Simultaneously opened thereafter by suitably applying photolithography and dry etching are a connection hole 28a for connecting a plug 18b and a capacitive lower electrode 34a described hereinbelow in the DRAM array area, and a connection hole 28b for connecting a plug 21b and a lower electrode 34b of a chalcogenide element described hereinbelow in the PCRAM array area. However, since the connection holes 28a and 28b are disposed between the bit lines BL_D and BL_P, as shown in FIGS. 2A and 2B, a short-circuit between the bit lines BL_D and BL_P must be avoided. Therefore, the connection hole SN_contacts shown in FIGS. 2A and 2B are first opened in a hard mask 27a formed on the entire surface of the semiconductor substrate 1, after which another film is further formed on the entire surface of semiconductor substrate 1 in the same manner, and the product is subjected to anisotropic dry etching to form a sidewall spacer 27b on the side wall of the opened portion. The diameter of the connection holes 28a and 28b obtained by photolithography described above can thereby be reduced, and a short-circuit between the two layers can be prevented even if positioning between the bit lines BL_D and BL_P and the connection hole SN_contacts shown in FIGS. 2A and 2B is offset.

Next, connection holes 29a and 29b are simultaneously formed by using the above-described pattern as a mask, and dry etching the insulation films 26, 23, and 20.

Figure 9:
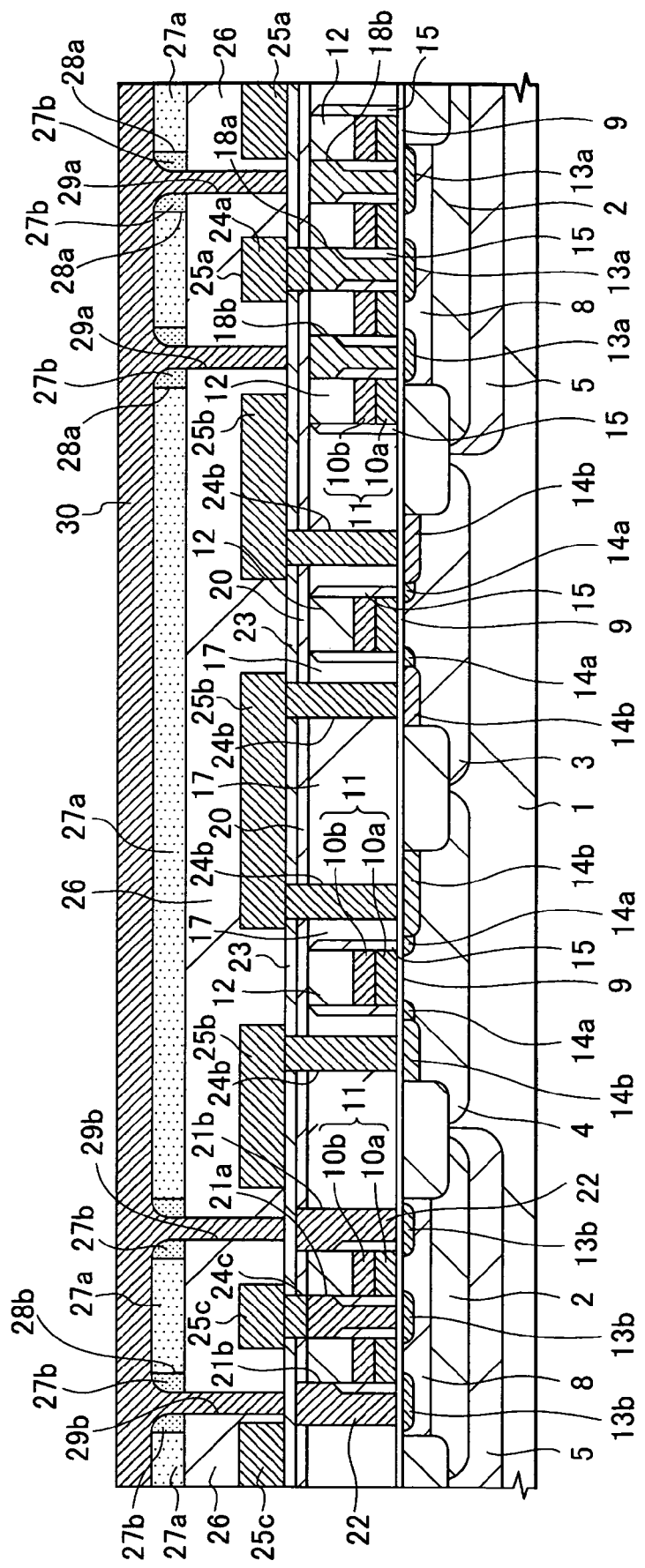
FIG. 9 is a partial cross-sectional view showing the main components of the memory device 100.

A film that acts as a plug 31 (31a and 31b) is deposited on the entire surface of the semiconductor substrate 1 to a thickness of twice or more of the diameter of the connection holes 29 (29a and 29b), as shown in FIG. 9. The film may, for example, be a tungsten film 30. In this case, a cobalt (Co), titanium (Ti), tantalum (Ta), tungsten (W), or other silicide film is preferably formed prior to the formation of the tungsten film 30 in order to assure good electrical conductivity with the undercoating elements with which the plug 31 makes contact.

Figure 10:
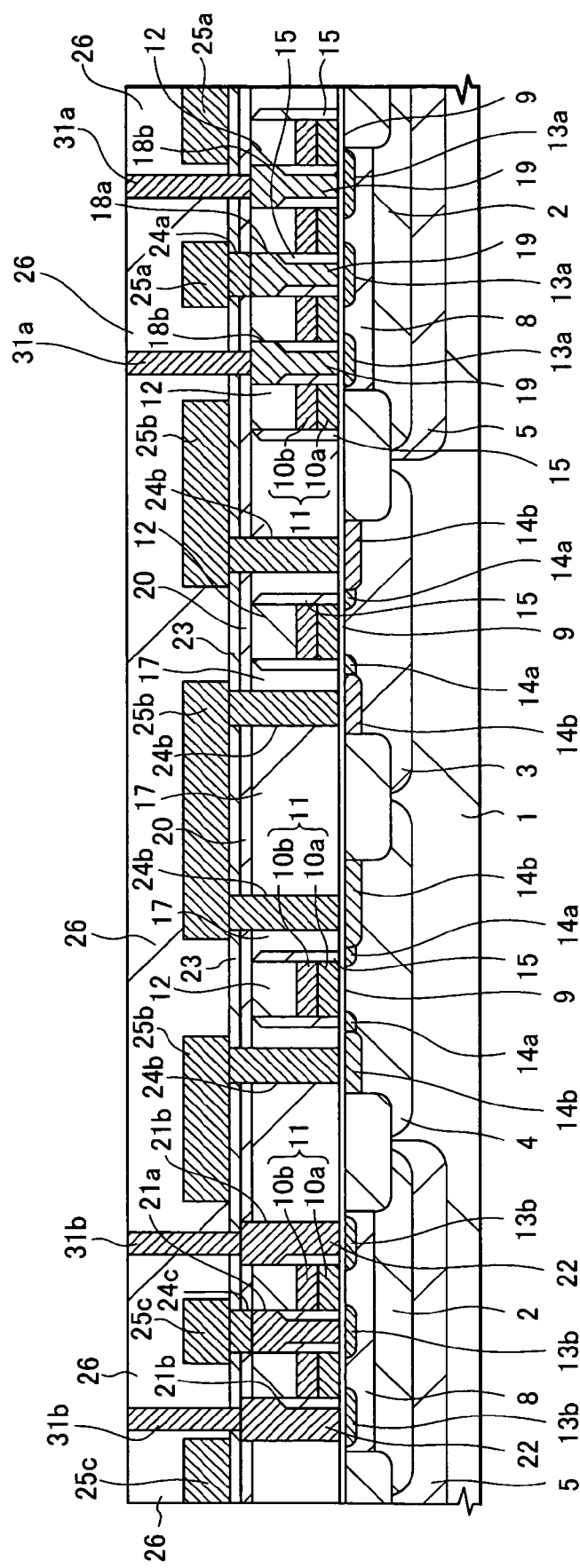
FIG. 10 is a partial cross-sectional view showing the main components of the memory device 100 of the first embodiment of the present invention.

Next, plugs 31 (31a and 32b) embedded only inside the connection holes 29 are formed by performing, for example, CMP-based polishing on the conductive film 30 deposited in order to embed the connection holes 29, as shown in FIG. 10.

As described above, the sidewall spacer 27b and the hard mask 27a are preferably the same material as the film 30 for embedding the connection holes 29. The spacer and the mask have been formed in order to form the connection holes 29 shown in FIG. 8 to smaller dimensions than those provided by photolithography in the process flow for forming the plug 31. In other words, since these are polished together with the embedded tungsten film 30 in the step for polishing by CMP described in FIG. 10, the step for removing the hard mask 27a and the sidewall spacer 27b can be omitted.

Figure 11:
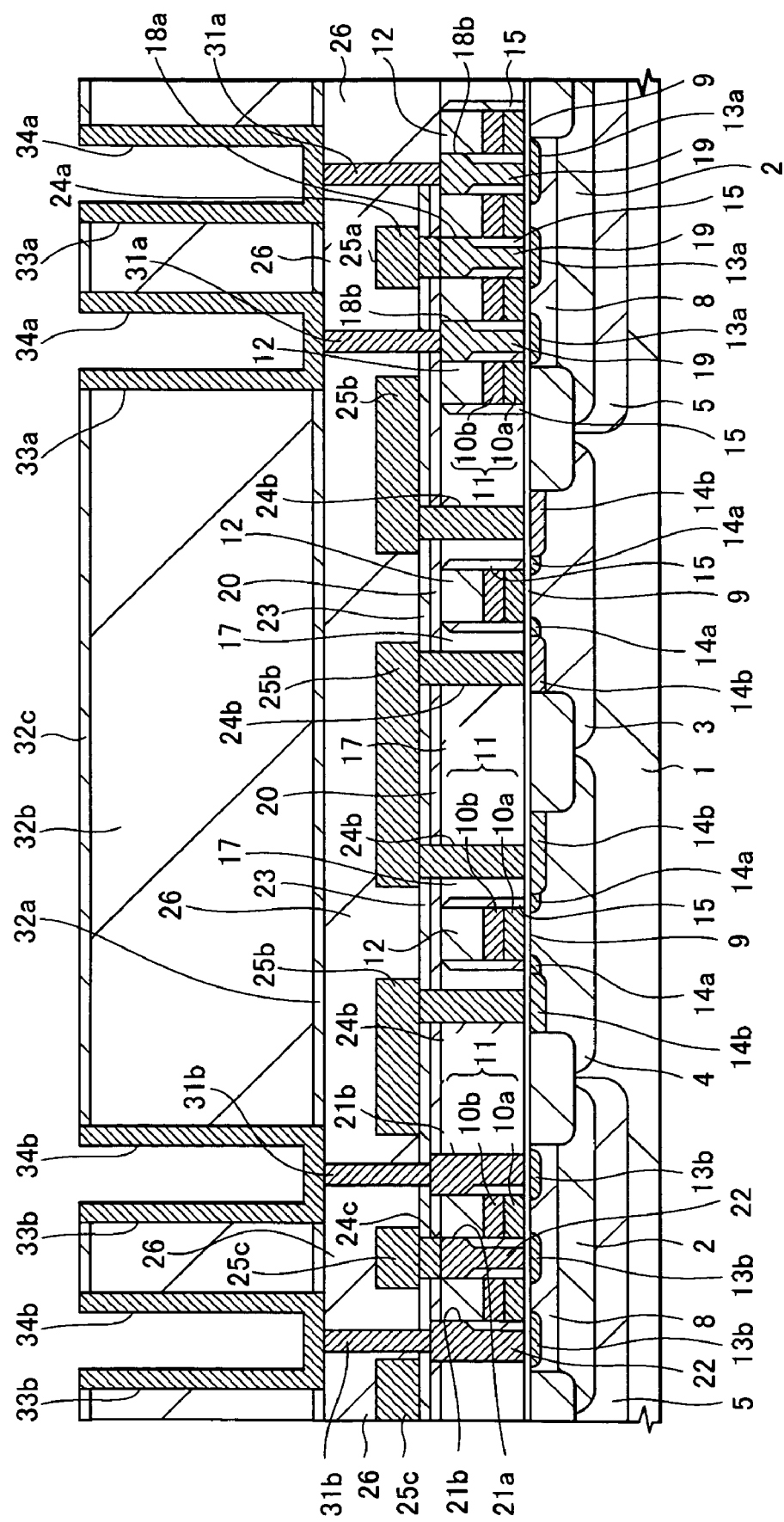
FIG. 11 is a partial cross-sectional view showing the main components of the memory device 100 of the first embodiment of the present invention.

Constructed next are the capacitive lower electrode 34a in the DRAM array area and the lower electrode 34b of the chalcogenide element in the PCRAM array area, as shown in FIG. 11. Since the two are simultaneously constructed with the same process, the DRAM portion alone is described here.

A method for opening a cylinder 33a in the insulation film 32 and forming the capacitive lower electrode 34a inside the cylinder is adopted in the formation of the capacitive lower electrode 34a. In accordance with this method, a difference in the height between the DRAM array area and the peripheral circuit area due to the height of the capacitive lower electrode 34a can be prevented, the focal depth in photolithography can be provided with greater tolerance, and wiring in the upper layer in particular can be made stable for microfabrication.

First, an insulation layer 32 (32a, 32b, and 32c) is formed to a thickness that is greater than the height required for the capacitive lower electrode 34a, and a cylinder 33a for forming a lower electrode is formed. Plasma TEOS oxide film, for example, is preferably used as the thick intermediate insulation film 32b of the insulation films 32, and silicon nitride films are preferably used as the upper and lower thin insulation films 32a and 32c. The cylinder 33a for forming a lower electrode is preferably formed by three-stage etching that has a first etching step for etching a silicon nitride film 32c with the TEOS oxide film 32b acting as a stopper, a second etching step for etching TEOS oxide film 32b with the silicon nitride film 32a acting as a stopper, and a third etching step for etching the silicon nitride film 32a. Excessive etching of the insulation film 26 formed below the cylinder 33a for forming a lower electrode can thereby be prevented.

The capacitive lower electrode 34a is formed next. Titanium nitride (TiN), tantalum nitride (TaN), tungsten nitride (WN), titanium aluminum nitride (TiAlN), ruthenium (Ru), iridium (Ir), platinum (Pt), or the like is deposited by CVD or ALD (Atomic Layer Deposition) on the capacitive lower electrode 34a to a thickness that is about ⅓ that of the narrow side of the lower electrode cylinder 37. To separate the lower electrode of the adjacent cell, the electrode may be embedded in a photoresist to protect the lower electrode inside the cylinder, and etchback by dry etching may be performed in this state to remove the capacitive lower electrode 34a formed on the upper surface of the silicon nitride film 32a. The capacitive lower electrode 34a is thereby left remaining only inside the cylinder. Polishing by CMP may be used in lieu of etching back as the method of removing the unnecessary capacitive lower electrode 34a. The photoresist previously used for embedding is removed following the etchback to complete the formation of the capacitive lower electrode 34a.

Figure 12:
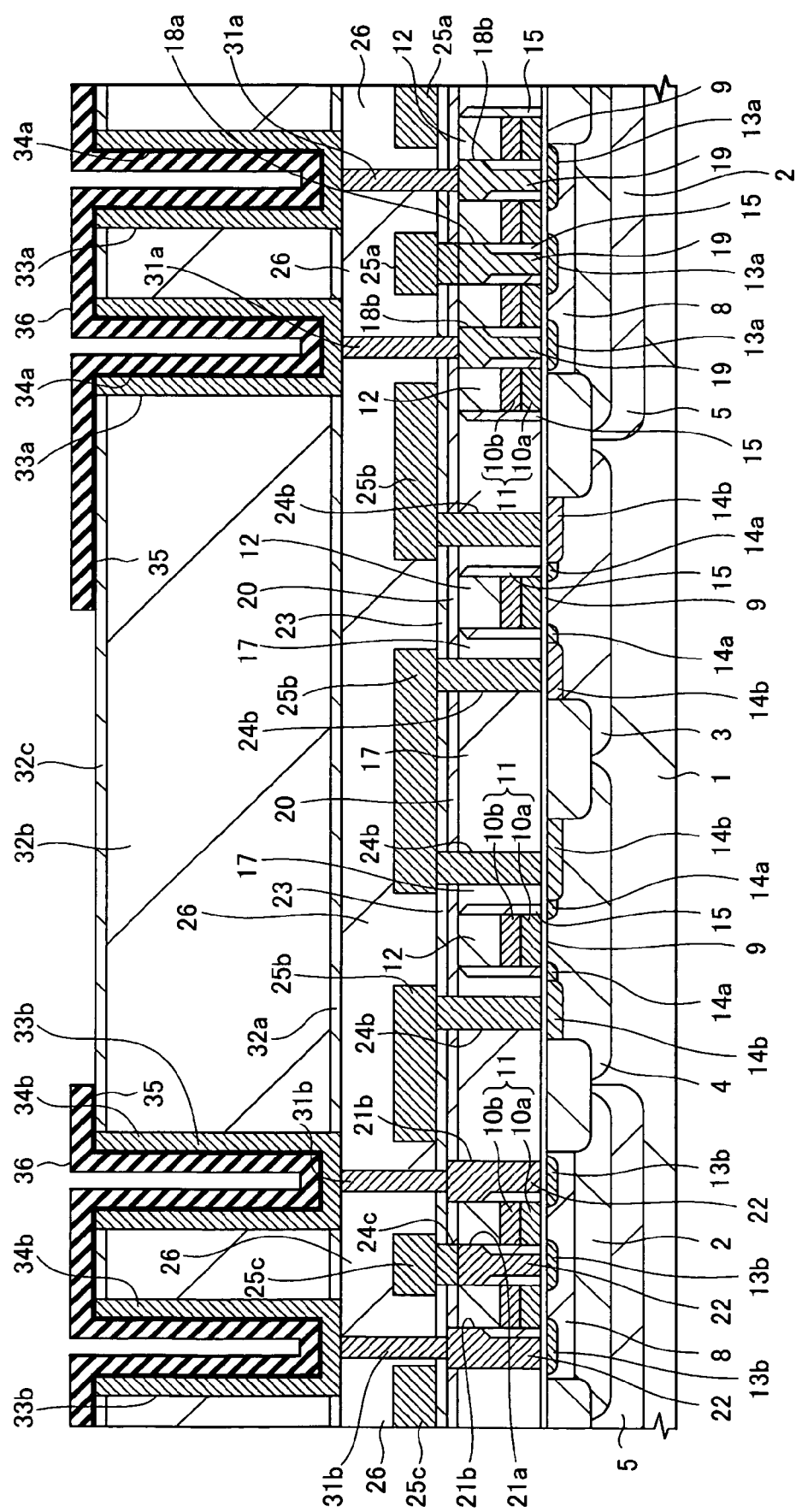
FIG. 12 is a partial cross-sectional view showing the main components of the memory device 100 of the first embodiment of the present invention.

The capacitive insulation film 35 and capacitive upper electrode 36 are then formed as shown in FIG. 12. Aluminum oxide ($Al_2O_3$), hafnium oxide (HfO), tantalumpentoxide ($Ta_2O_5$), BST ($BaSrTiO_x$), STO ($SrTiO_x$), or the like may be formed as the capacitive insulation film 35 by CVD or ALD. Since the films contain a considerable level of oxygen deficiency in the film immediately after deposition, leak current cannot be kept at or below the desired design value, $1\times10^{-8}$ $A/cm^2$ or less, for example, if left unchanged. Therefore, the films are preferably heat treated in an oxygen or ozone atmosphere after deposition. The capacitive upper electrode 36 can be fabricated using the same method as the capacitive lower electrode 34.

Envisioned in the above description is the case in which an MIM (Metal Insulator Metal) structure capacitor is used as the DRAM capacitance, but in addition to this, an MIS (Metal Insulator Semiconductor) structure that uses a polysilicon film, for example, may be used as the lower electrode. In this case, the polysilicon film which will serve as the lower electrode is preferably subjected to thermal nitridation before the capacitive insulation film is formed on the lower electrode, in order to minimize the formation of a layer with a low dielectric constant at the boundary.

Since the steps described above are carried out simultaneously in the PCRAM array area, a capacitor having the same structure as the DRAM array area can also be formed in the PCRAM array area, as shown in FIG. 12.

Figure 13:
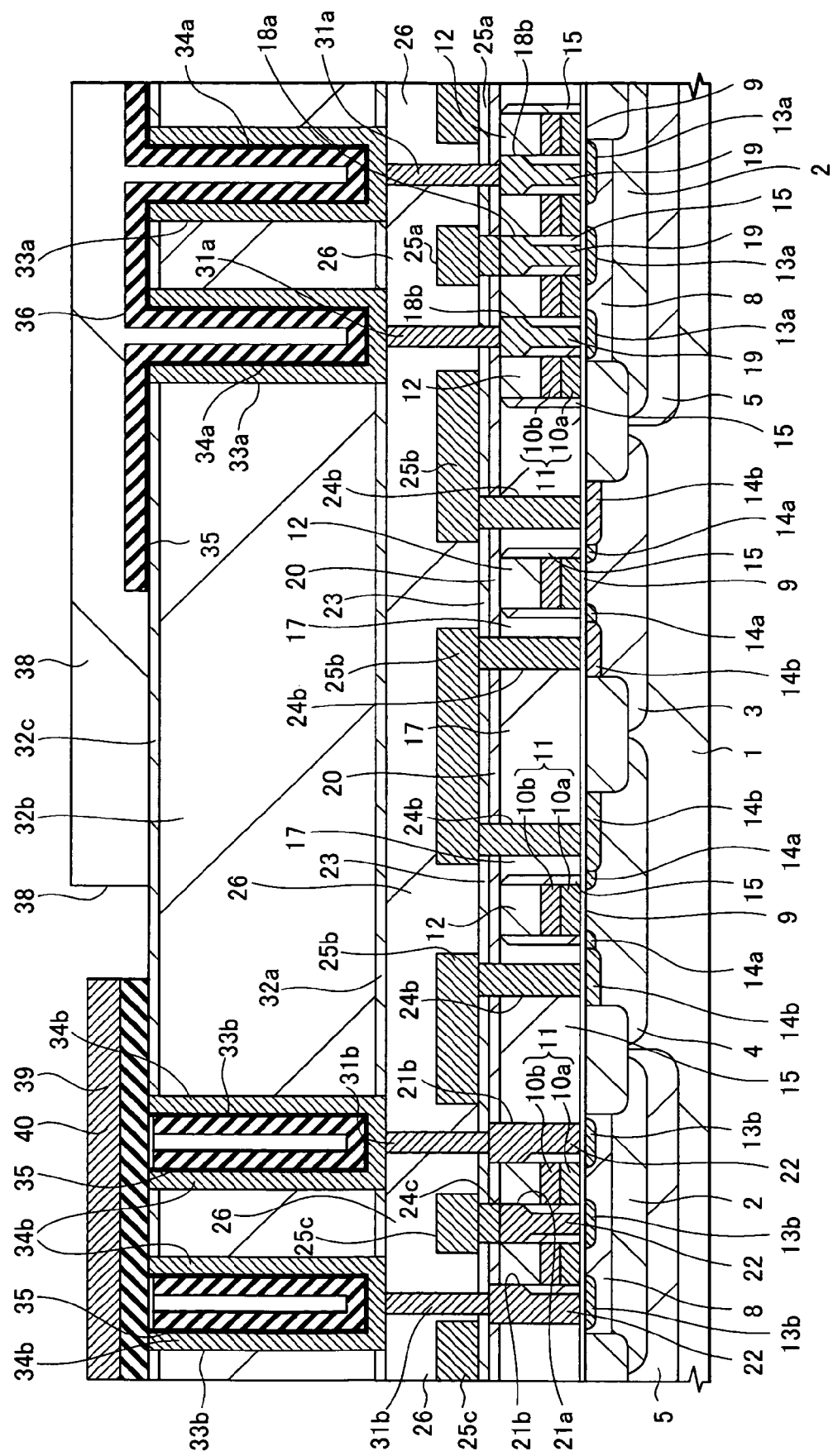
FIG. 13 is a partial cross-sectional view showing the main components of the memory device 100 of the first embodiment of the present invention.

A chalcogenide element is formed next, as shown in FIG. 13. First, the upper electrode 36 of the capacitive portion of the DRAM is formed, and a silicon oxide film 38 is then deposited on the entire surface of the semiconductor substrate 1. Next, photolithography and dry etching are applied to open a PCRAM array area, and the silicon oxide film 38 formed in the PCRAM array area is removed. In this case, the interlayer insulation film 32b of the undercoating can be prevented from being excessively cut down by using as a stopper the silicon nitride film 32c formed in advance below the upper electrode 36 of the capacitive portion of the DRAM.

Next, the lower electrode 34b of the chalcogenide element formed earlier simultaneously with the DRAM capacitive lower electrode 34a is exposed by removing the capacitive upper electrode 36 of the exposed PCRAM array area and the underlying capacitive insulation film 35 by dry etching.

$Ge_2Sb_2Te_5$ may then be deposited to a thickness of between 50 nm and 200 nm as the chalcogenide film 39 on the entire surface of the semiconductor substrate 1, and a tungsten film may be further deposited to a thickness of 100 nm as the upper electrode 40, by sputtering, for example. A chalcogenide element CDN such as that shown in FIG. 2A is subsequently formed by patterning the two layers by using photolithography and dry etching. A material containing two or more elements selected from germanium (Ge), antimony (Sb), tellurium (Te), selenium (Se), or other elements may be used as the chalcogenide film 39.

Figure 14:
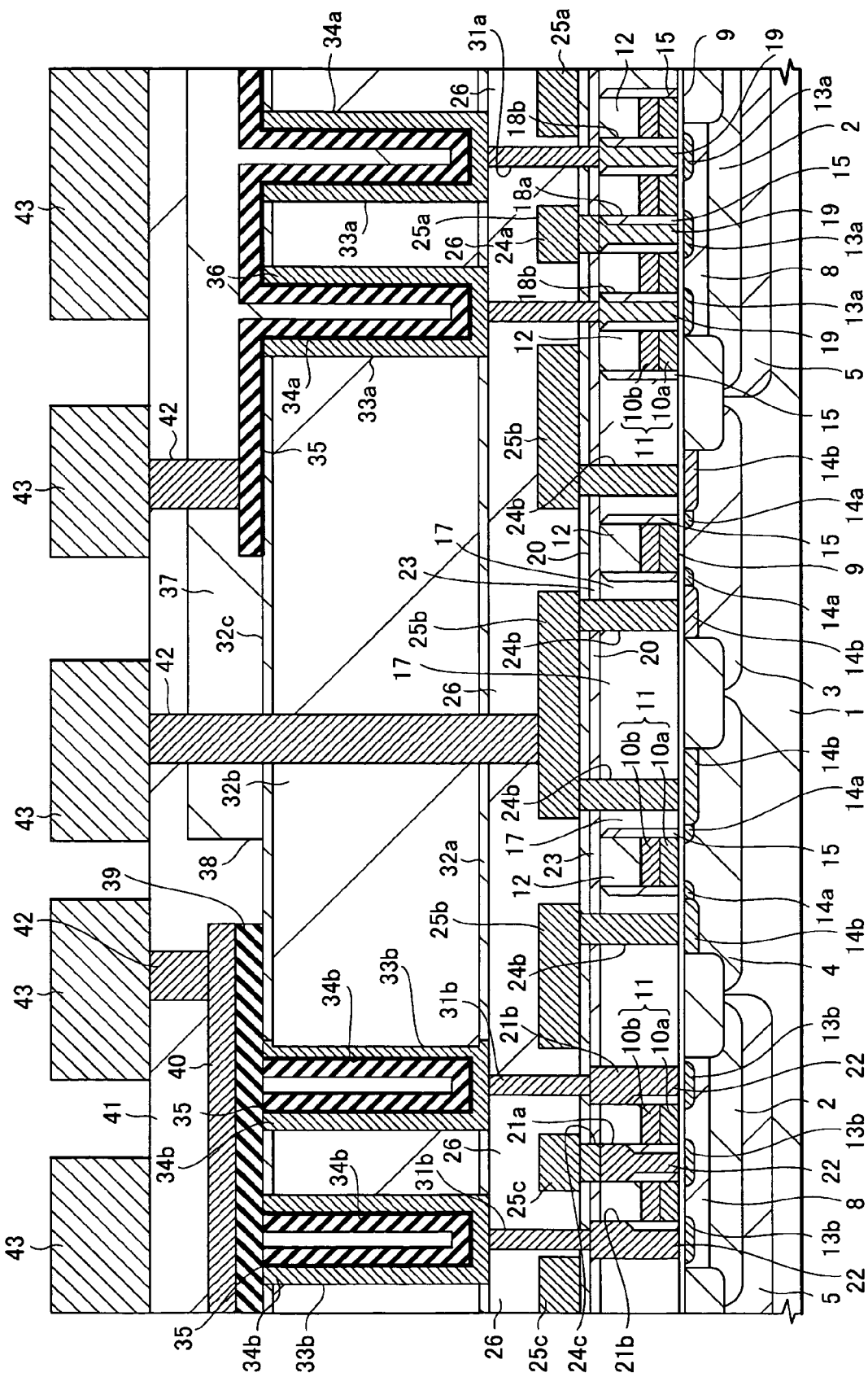
FIG. 14 is a partial cross-sectional view showing the main components of the memory device 100.

Silicon oxide film is deposited by plasma deposition, for example, as the interlayer insulation film 41 on the entire surface of the semiconductor substrate 1, as shown in FIG. 14. In this case, the surface of the silicon oxide film 38 shown in FIG. 13 can be smoothed by polishing with CMP, for example, in order to remove the resulting height differences.

A second layer wiring 43 is furthermore formed, and the second layer wiring 43 and capacitive upper electrode 36 or first layer wiring (bit line) 25b are connected via a connection hole 42. A laminate composed of titanium nitride (TiN), aluminum (Al), and a titanium nitride, for example, may be used as the second layer wiring 43, and laminate composed of titanium (Ti), titanium nitride, and tungsten may be used at the connection hole 42. A third layer of wiring or more layers of wiring may be disposed on the second layer wiring 43 by way of an interlayer insulation film, but a description thereof is omitted.

Figure 15:
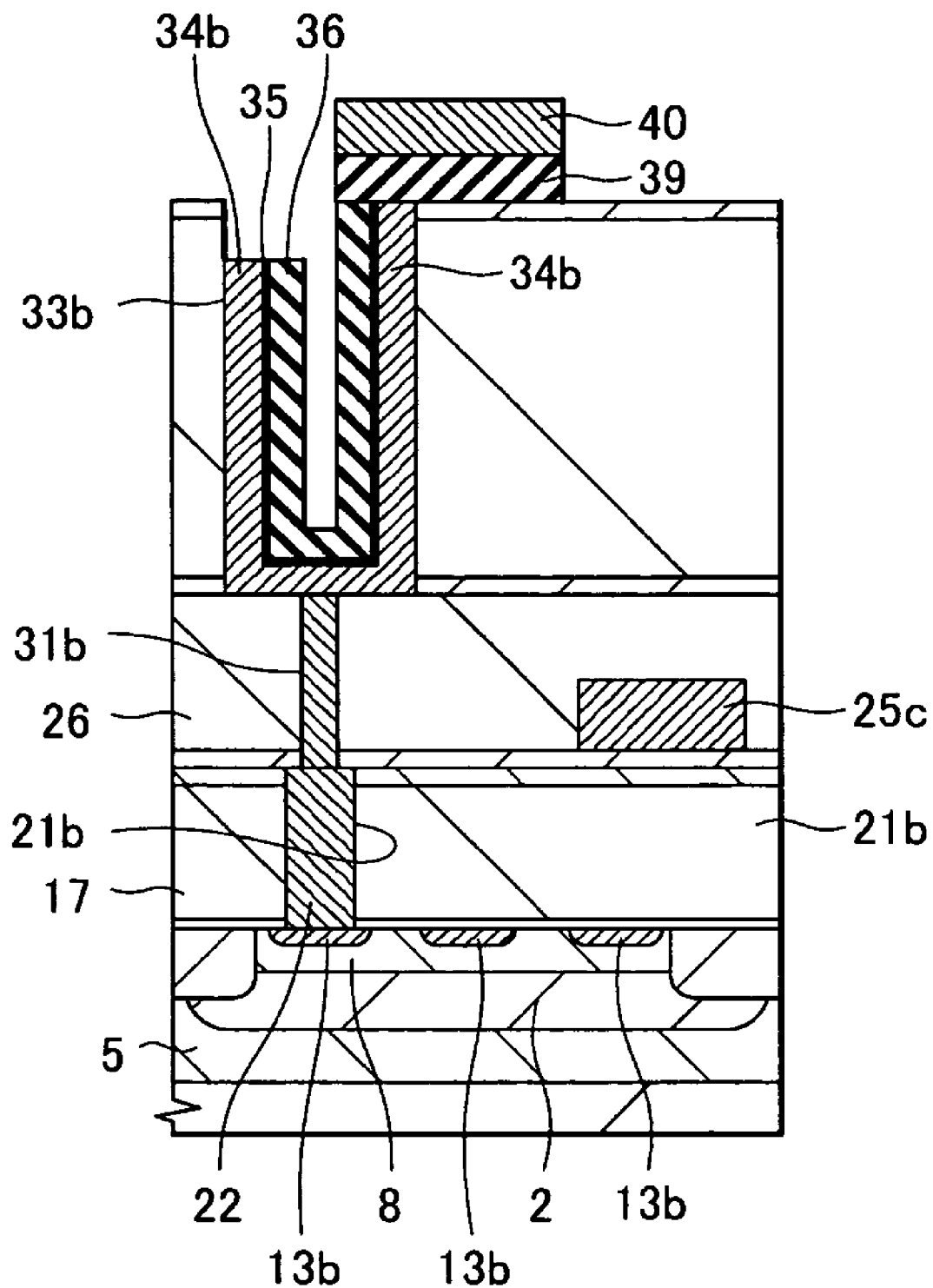
FIG. 15 is a partial cross-sectional view showing the main components of the memory device 100 of the first embodiment of the present invention.

FIG. 15 is a cross-sectional view along the word line direction of the PCRAM, and the diagram corresponds to the step shown in FIG. 13. The chalcogenide film 39 and PCRAM_upper electrode 40 are disposed in a direction orthogonal to the word lines. Here, the PCRAM_lower electrode 34b and the chalcogenide film 39 preferably make contact with the lowest possible amount of surface area. In this case, contact is made only at one end of the cylindrically-shaped PCRAM_lower electrode 34b. Efficient heating is thereby made possible and the chalcogenide film 39 can undergo a rapid phase change (from crystal to amorphous and back).

Figure 16:
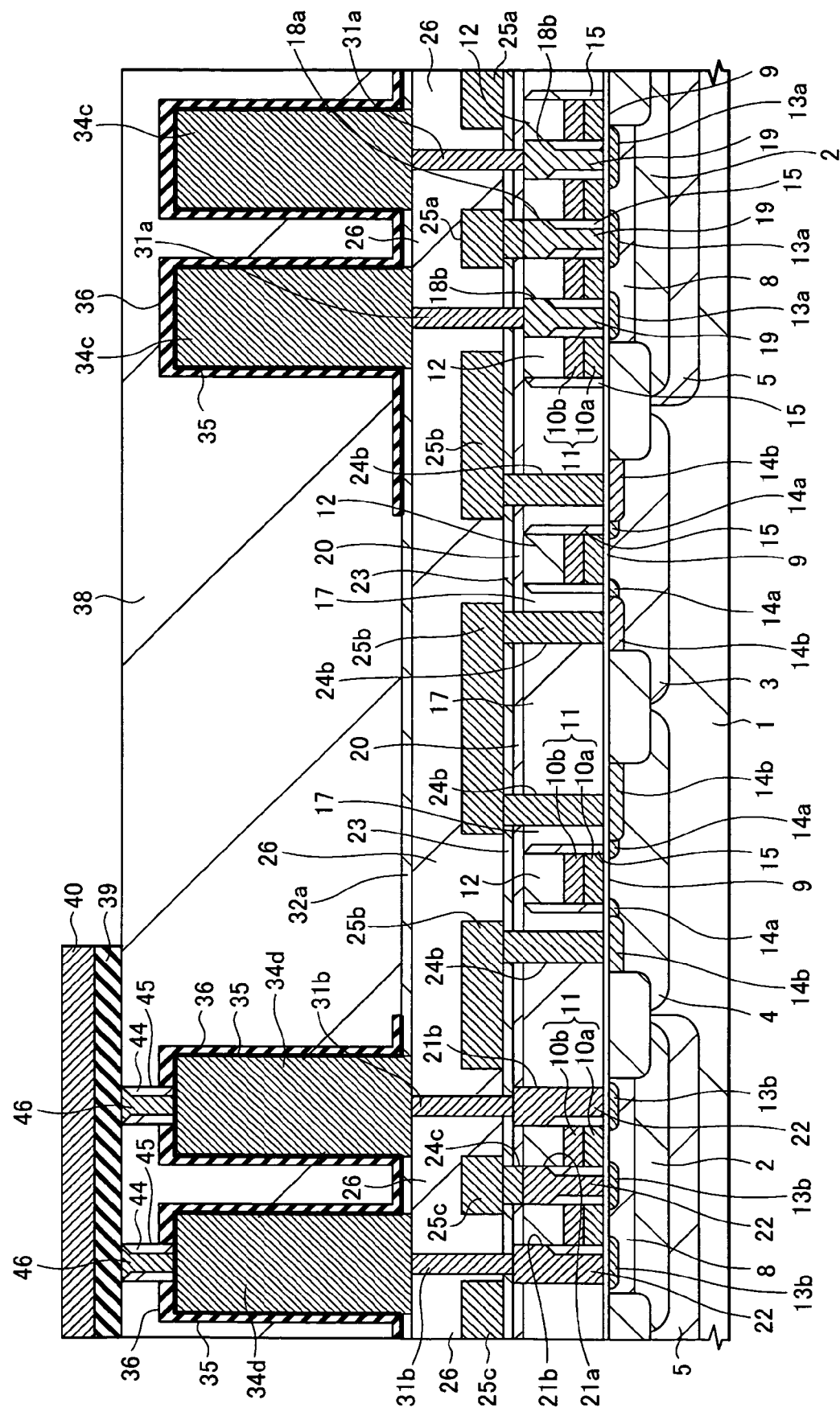
FIG. 16 is a partial cross-sectional view showing the main components of the memory device of the second embodiment of the present invention.

FIG. 16 is a partial cross-sectional view showing the main components of the memory device of the second embodiment of the present invention. In the present embodiment, the manufacturing method and structure of the DRAM capacitive lower electrode are different than those described above in the first embodiment. More specifically, in the present embodiment, the DRAM capacitive lower electrode 34c has a columnar shape, and the DRAM capacitive upper electrode 36 is also formed in substantially the same position (that is, the surface of the interlayer insulation film 32a) as the lower surface of the columnar capacitive lower electrode 34c. Therefore, even if the upper electrode 36 is removed in the PCRAM array area and a chalcogenide film 39 is formed on the surface of the exposed DRAM capacitive lower electrode 34c by the method described using FIG. 13, each bit cannot be separated due to electrical short-circuiting caused by the upper electrode 36. In other words, the DRAM capacitive lower electrode 34c cannot be used as a PCRAM lower electrode. In view of the above, in the present embodiment, the lower electrode 34c is used as a plug 34d in the PCRAM array area, and a connection is made with the chalcogenide element lower electrode 46 by removing a portion of the DRAM capacitive insulation film 35 and the overlying DRAM upper electrode 36.

First, the bit line 25 and interlayer insulation film 26 as the overlying layer are formed by the same steps as those used up to FIG. 10 of the first embodiment of the present invention. Next, a capacitive cylinder is formed by the same procedure as that shown in FIG. 11 of the first embodiment, and the capacitive lower electrode 34c is formed thereafter. Titanium nitride (TiN), tantalum nitride (TaN), tungsten nitride (WN), titanium aluminum nitride (TiAlN), ruthenium (Ru), iridium (Ir), platinum (Pt), or the like may be deposited by CVD on the capacitive lower electrode 34c to a thickness that allows the capacitive cylinder to be embedded. The embedded lower electrode material is subsequently polished by CMP, for example. A silicon insulation film 32b for forming the capacitive cylinder is removed by wet etching, for example, and the side surface of the capacitive lower electrode 34c is exposed. Here, a silicon nitride film 32a disposed in advance below the silicon insulation film 32b serves as a wet etching stopper, and prevents the lower portions of interlayer insulation film 26 from being excessively etched.

The DRAM capacitive insulation film 35 and DRAM capacitive upper electrode 36 are thereafter formed by the same method and with the same materials as the first embodiment. A new interlayer insulation film 38 is furthermore deposited thereon, and the uneven portions of the DRAM capacitive portion are smoothed.

Capacitors having the same structure are thereby formed in the DRAM array area and PCRAM array area.

Next, a connection hole 44 is formed in the interlayer insulation film 38 in the PCRAM array area by using photolithography and dry etching. Since the narrow side direction of the lower electrode 34c is ordinarily equal to the smallest workable dimension, the narrow side dimensions of the connection hole 44 and lower electrode 34c are substantially equal in the direction orthogonal to this direction, although this is not depicted in FIG. 16. Therefore, a connection hole 44 is reliably formed in the upper portion of the lower electrode 34c by providing a side wall 45 inside the connection hole 44.

Metal or a nitride thereof is next deposited by CVD, for example, as the PCRAM lower electrode 46 inside the connection hole 44 in which the side wall 45 is formed, and a plug-shaped PCRAM lower electrode 46 is subsequently constructed by polishing with CMP, for example.

Next, a chalcogenide film 39 and an upper electrode 40 (source line) are deposited to a desired thickness by sputtering, for example, and patterning is performed by using photolithography and dry etching.

Since the PCRAM lower electrode 46, chalcogenide film 39, and upper electrode 40 are the same as the first embodiment, a description thereof is omitted.

Figure 17:
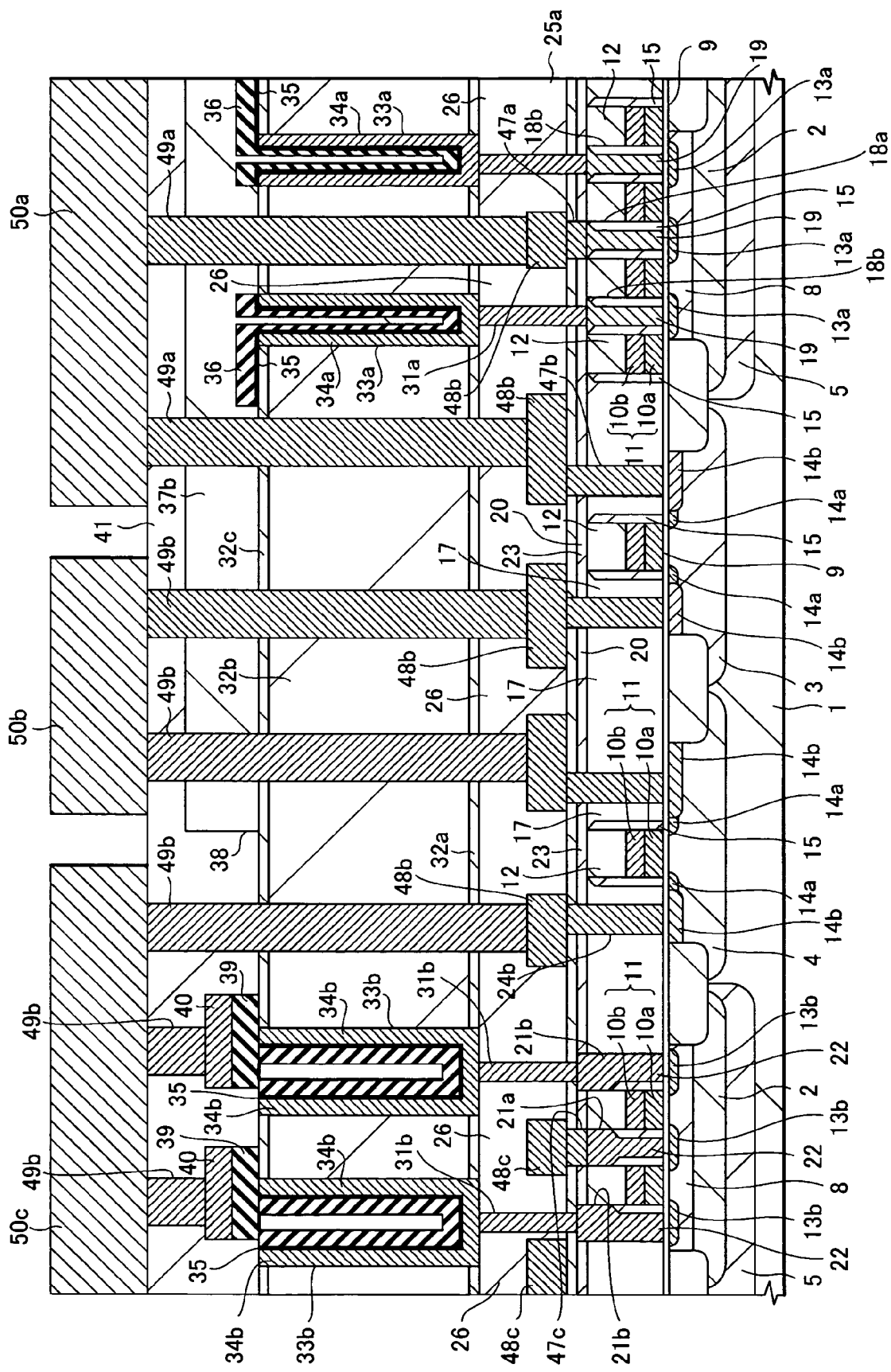
FIG. 17 is a partial cross-sectional view showing the main components of the memory device of the third embodiment of the present invention.

FIG. 17 is a partial cross-sectional view showing the main components of the memory device of the third embodiment of the present invention. In the present embodiment, a CUB (Capacitor Under Bit-line) structure is adopted as the formation method of DRAM capacitance. Therefore, a bit line 50 shared by the DRAM and PCRAM is formed after the capacitive portion is constructed. The method of forming the chalcogenide element in the PCRAM array area is the same as the first embodiment. In the present embodiment, the relationship of the bit line and source line as viewed from the select transistor T2 of the PCRAM is reversed. In other words, the PCRAM upper electrode is connected to the bit line of the DRAM via the sense amplifier SA. Also, the source line rather than the bit line is disposed below the phase-change element of the PCRAM.

Next, the fourth embodiment of the present invention is described in detail with reference to FIGS. 18 to 21.

Figure 18:
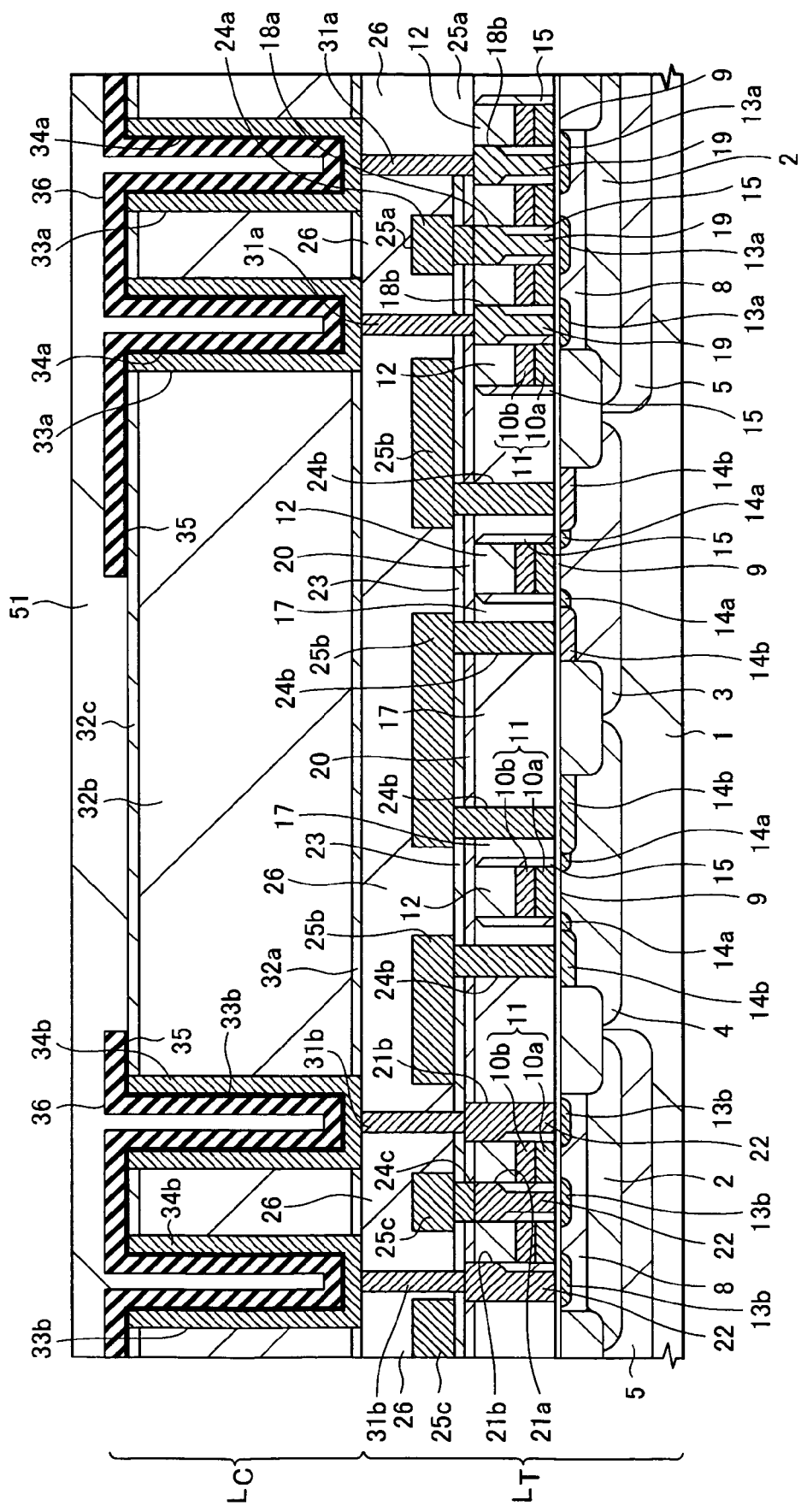
FIG. 18 is a partial cross-sectional view showing the main components of the memory device of the fourth embodiment of the present invention.

First, a transistor layer $L_T$ and capacitive layer $L_C$ are sequentially constructed by the same steps as those used from FIGS. 1 to 12 of the first embodiment of the present invention. Next, a silicon oxide film (TEOS oxide film) is formed by CVD as the interlayer insulation film 51 on the entire surface of the semiconductor substrate 1 on which the transistor layer $L_T$ is formed, as shown in FIG. 18. The surface is then smoothed by polishing using CMP. The thickness of the interlayer insulation film 51 can be about 200 nm, for example.

Figure 19:
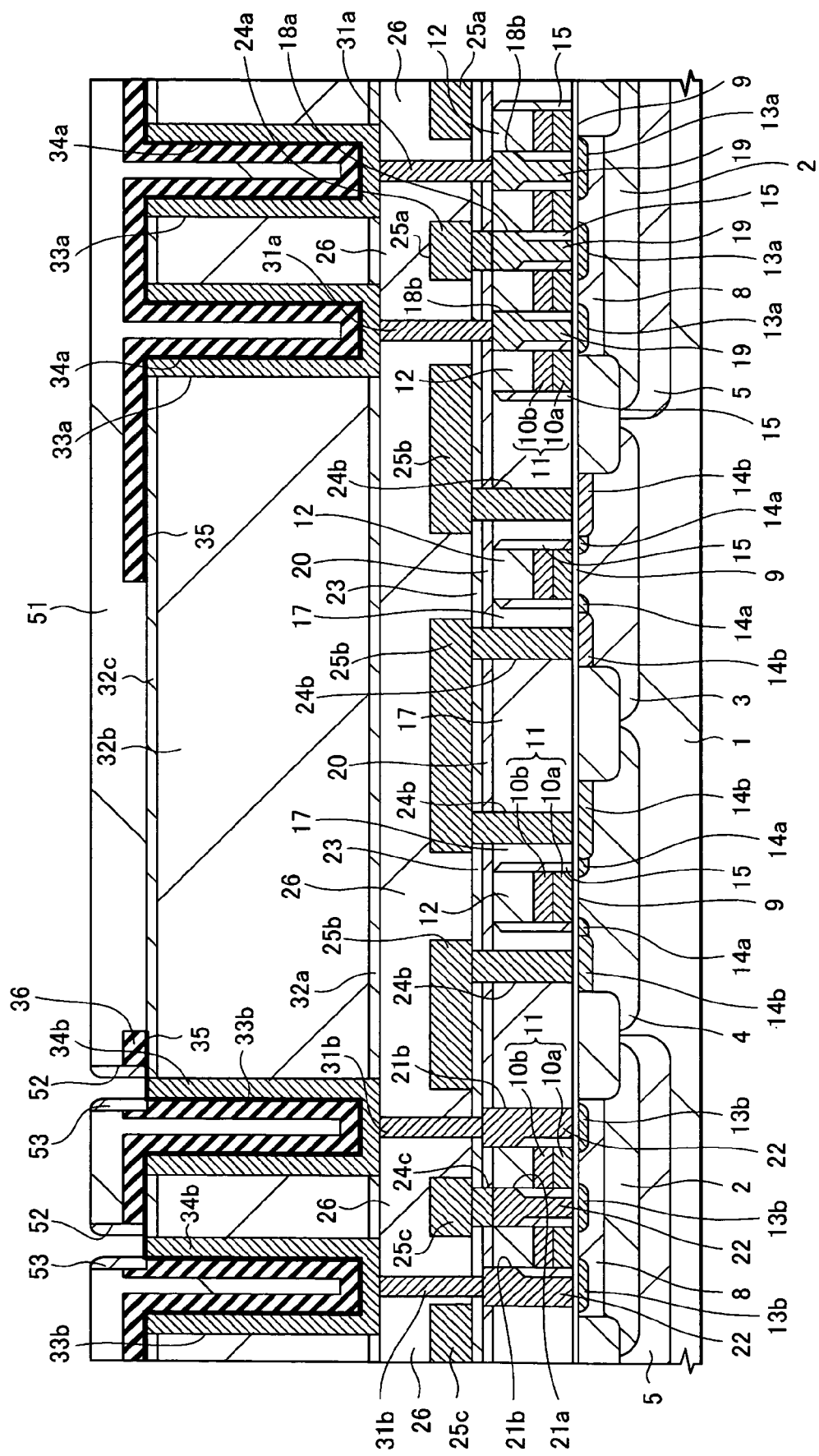
FIG. 19 is a partial cross-sectional view showing the main components of the memory device of the fourth embodiment of the present invention.

Next, an opening 52 for forming a chalcogenide element is formed in the interlayer insulation film 51 in the PCRAM array area using photolithography and dry etching, as shown in FIG. 19. The opening 52 passes through the upper electrode 36, but does not pass through the capacitive insulation film 35. A side wall 53 is formed inside the opening 52. Contact between the chalcogenide element and the capacitive upper electrode 36 can thereby be prevented, and the opening diameter obtained by photolithography described above can be further reduced.

Figure 20:
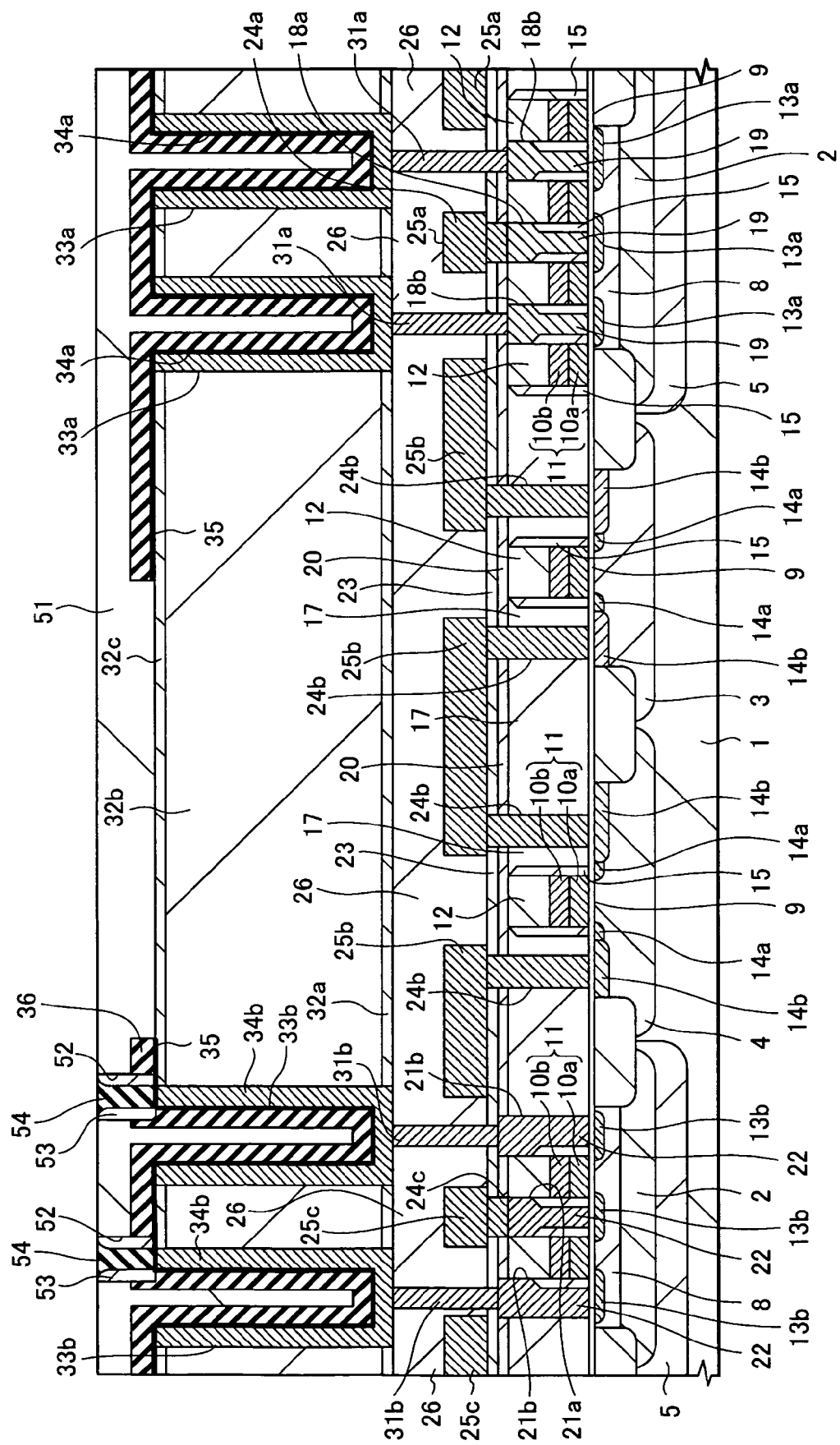
FIG. 20 is a partial cross-sectional view showing the main components of the memory device of the fourth embodiment of the present invention.

Next, $Ge_2Sb_2Te_5$, for example, is then deposited by sputtering as the chalcogenide film 54 inside the opening 52 in which the side wall 53 is formed, as shown in FIG. 20. The chalcogenide film 54 is left solely inside the opening 52, and the excess chalcogenide film 54 deposited on the surface of the interlayer insulation film 51 is removed by polishing with CMP, for example.

Figure 21:
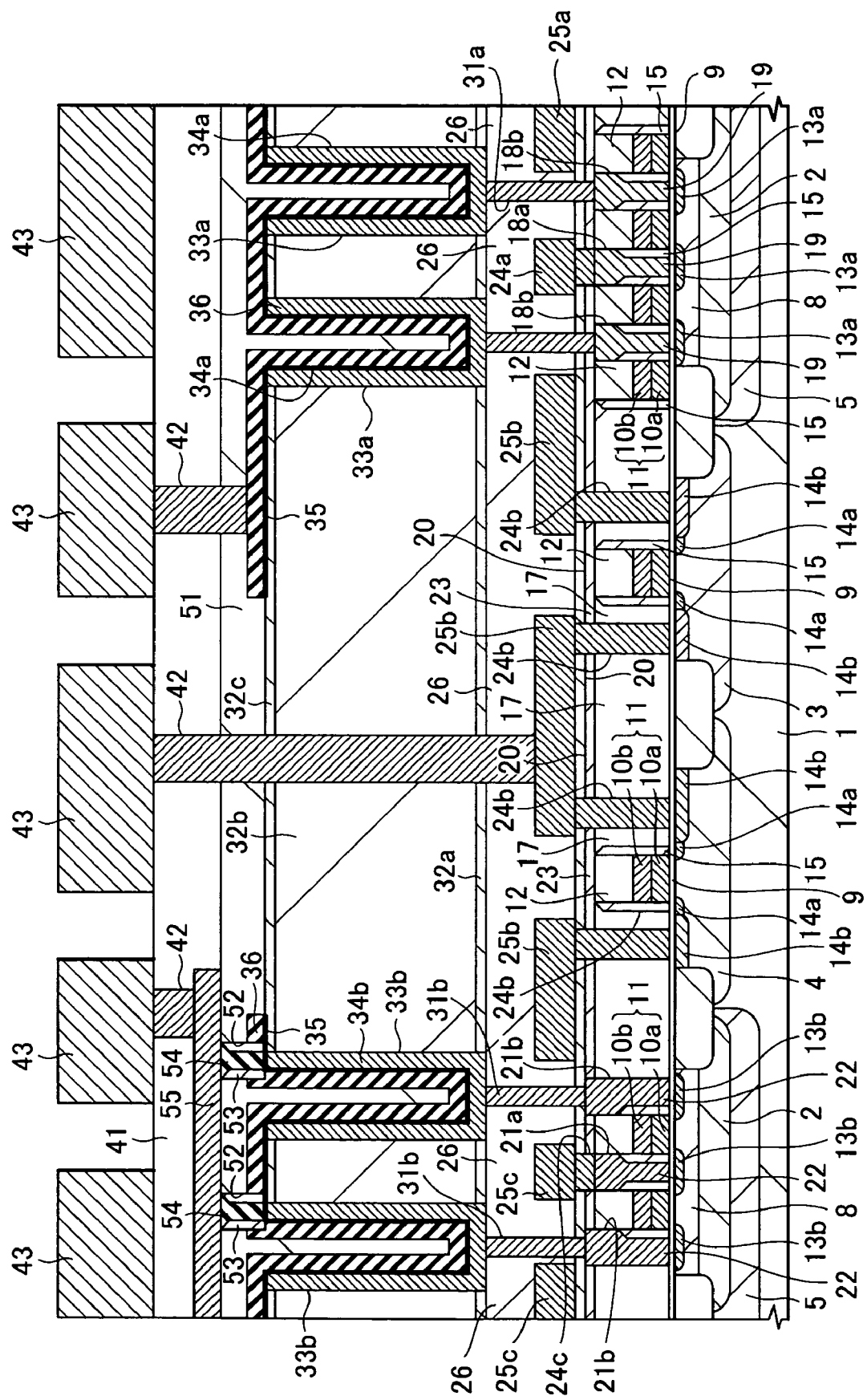
FIG. 21 is a partial cross-sectional view showing the main components of the memory device of the fourth embodiment of the present invention.

A tungsten film is subsequently deposited by sputtering to a thickness of, for example, about 100 nm as an upper electrode 55 of the chalcogenide element on the surface of the interlayer insulation film 51 that includes the upper surface of the chalcogenide film 54, as shown in FIG. 21. A chalcogenide element CND such as that shown in FIG. 2A is then formed by using photolithography and dry etching to pattern an upper electrode 55.

Next, a silicon oxide film is formed by plasma deposition, for example, as the interlayer insulation film 41 on the entire surface of the semiconductor substrate 1, and the surface of the silicon oxide film is smoothed by polishing with the CMP method in order to remove the uneven portions of the silicon oxide film. The connection hole 42 and second layer wiring 43 are then formed, and a connection is formed via the connection hole 42 between the second layer wiring 43 and capacitive upper electrode 36, or the second layer wiring 43 and first layer wiring (bit line) 25b.

The PCRAM manufactured in this manner is configured with a capacitive insulation film 35 disposed between the chalcogenide film 54 and lower electrode 34b. Therefore, electric current does not flow, and the phase state of the chalcogenide film 54 cannot be changed. However, the insulation of the capacitive insulation film 35 is destroyed by applying a prescribed electric field to the capacitive insulation film 35, and since a very small hole (pinhole) is formed, the electrical conductivity of the capacitive insulation film 35 can be obtained, enabling the phase-change of the chalcogenide element. In this case, since the electric current pathway inside the chalcogenide film 54 is not dispersed and the electric current concentrates in the pinhole, the phase change of the chalcogenide film 54 can be efficiently carried out. Depending on the selection of the material of the capacitive insulation film, it is also possible to dispose with a special step for forming a pinhole.

Figure 22:
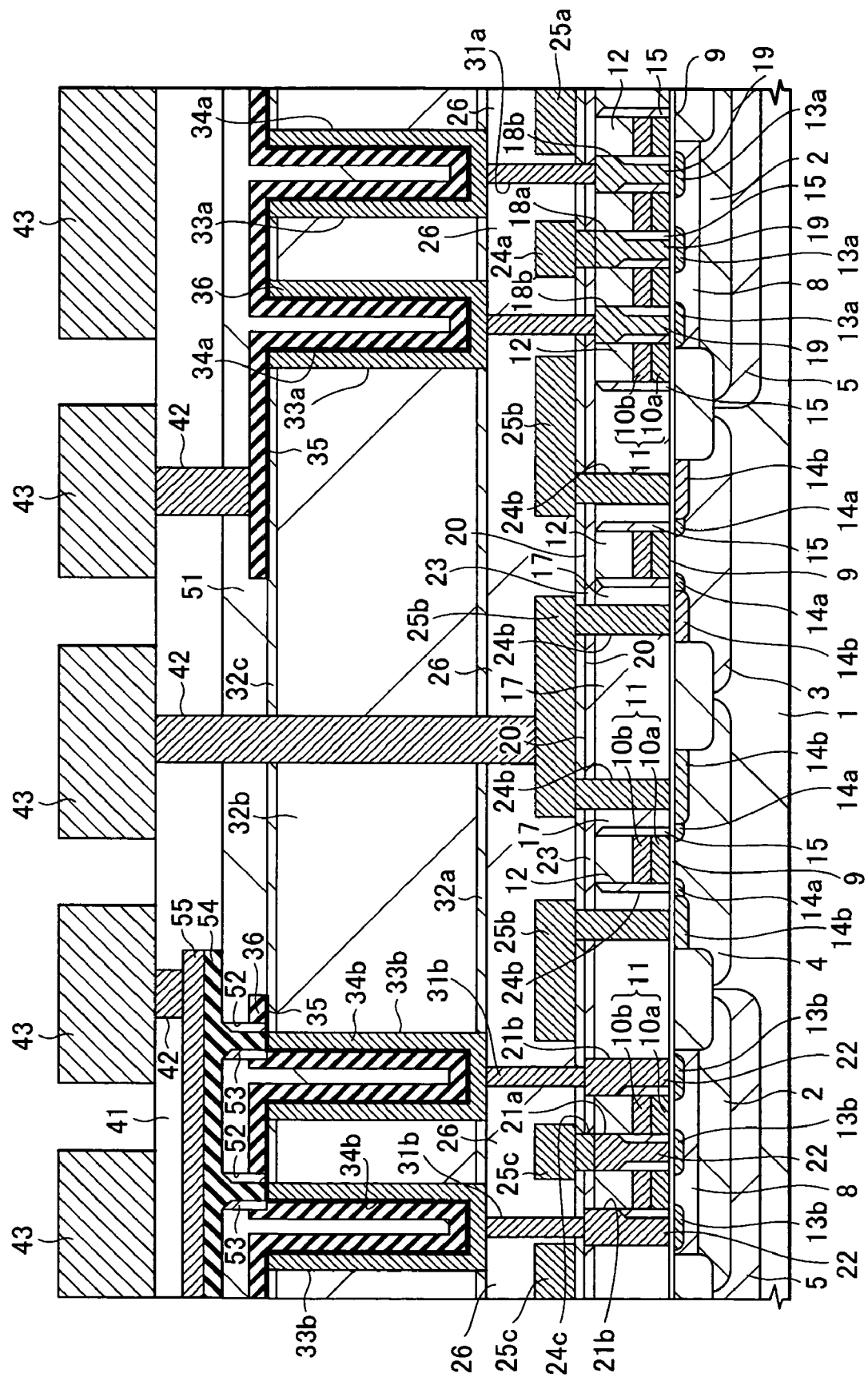
FIG. 22 is a partial cross-sectional view showing the main components of the memory device of the fifth embodiment of the present invention.

FIG. 22 is a partial cross-sectional view showing the main components of the memory device of the fifth embodiment of the present invention. The present embodiment differs from the fourth embodiment described above in that the chalcogenide film 54 is formed not only inside the opening 52 for forming the chalcogenide element, but is also formed on the surface of the interlayer insulation film 51. A chalcogenide element CND such as that shown in FIG. 2A is then formed by using photolithography and dry etching to pattern the chalcogenide film 54 together with the upper electrode 55.

Thus, in accordance with the present embodiment, in addition to the effects of the invention of the fourth embodiment described above, it is possible to eliminate the step for embedding a chalcogenide film 54 and the step for removing excess chalcogenide film by CMP, for example. Since the chalcogenide film 54 is not directly worked, it is also possible to reduce damage to the chalcogenide film 54.

Figure 23:
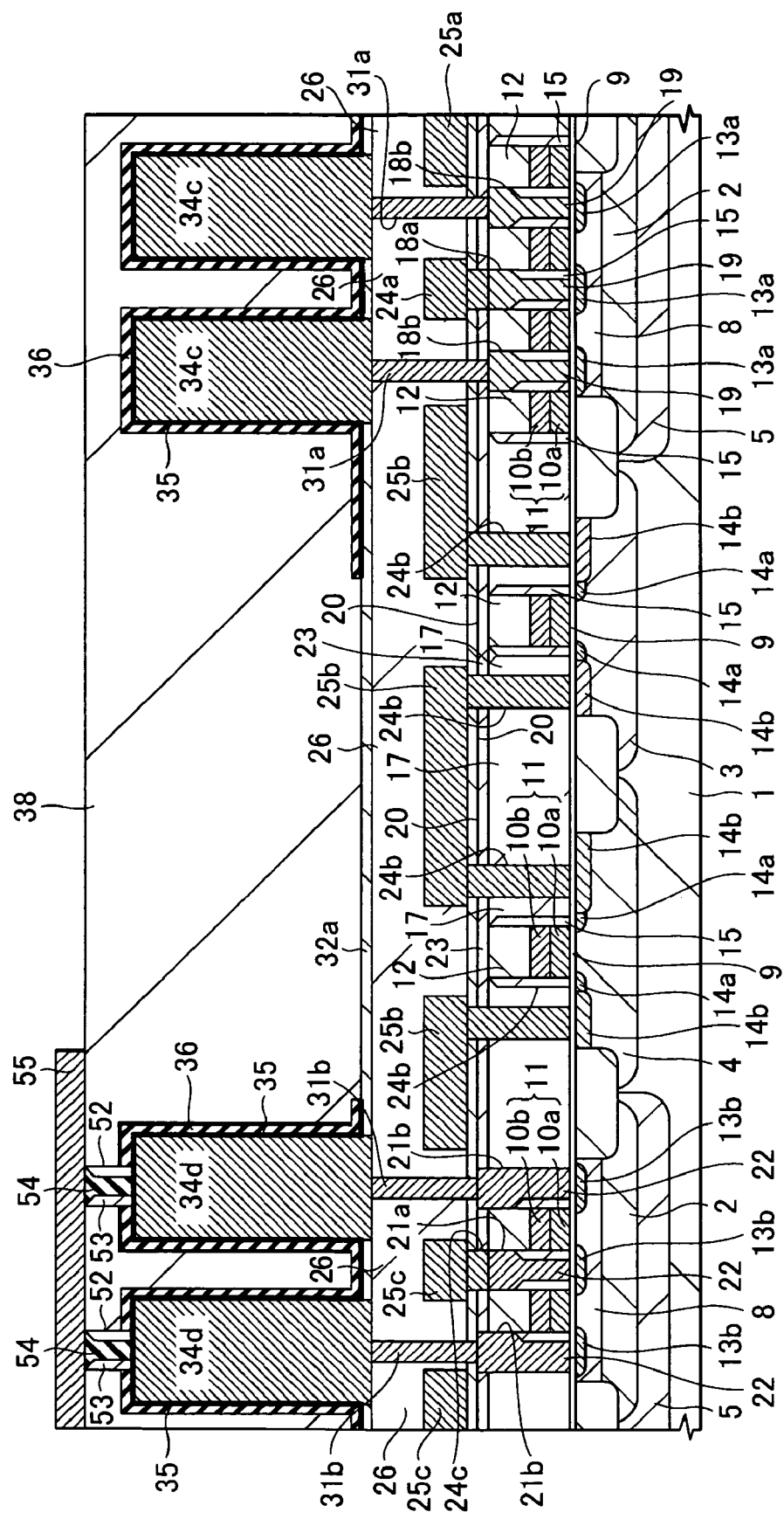
FIG. 23 is a partial cross-sectional view showing the main components of the memory device of the sixth embodiment of the present invention.

FIG. 23 is a partial cross-sectional view showing the main components of the memory device of the sixth embodiment of the present invention. The present embodiment is a modified example of the second embodiment described above, and differs from the second embodiment in that the connection hole 44 does not pass through the capacitive insulation film 35, and the capacitive insulation film 35 is disposed between the lower electrodes 34d. The insulation of the capacitive insulation film 35 is destroyed by allowing a prescribed electric current to flow and applying an electric field to the capacitive insulation film 35, and since a very small hole (pinhole) is formed, the electrical conductivity of the capacitive insulation film 35 can be obtained, enabling the phase-change of the chalcogenide element. In other words, in the same manner as in the fourth and fifth embodiments, a method is adopted in this embodiment in which the pinhole formed in the chalcogenide element is used and the electric current flowing to the chalcogenide element is caused to concentrate therein.

The manufacturing method of the memory device in accordance with the present embodiment is described next. First, an opening 52 is formed in the interlayer insulation film 38, as shown in FIG. 23. The opening 52 passes through the capacitive upper electrode 36, but does not pass through the capacitive insulation film 35. A side wall 53 is thereafter formed inside the opening 52, and the chalcogenide film 54 is embedded therein. Here, the excess chalcogenide film 54 deposited on the surface of the interlayer oxide film 38 is removed by polishing with CMP, for example. A tungsten film is subsequently deposited by sputtering to a thickness of, for example, 100 nm as an upper electrode 55 on the surface of the interlayer insulation film 38 that includes the upper surface of the chalcogenide film 54. A chalcogenide element CND such as that shown in FIG. 2A is then formed by using photolithography and dry etching to pattern an upper electrode 55. The steps thereafter are the same as those described with reference to FIG. 21 in the fourth embodiment, and a description thereof is omitted.

Figure 24:
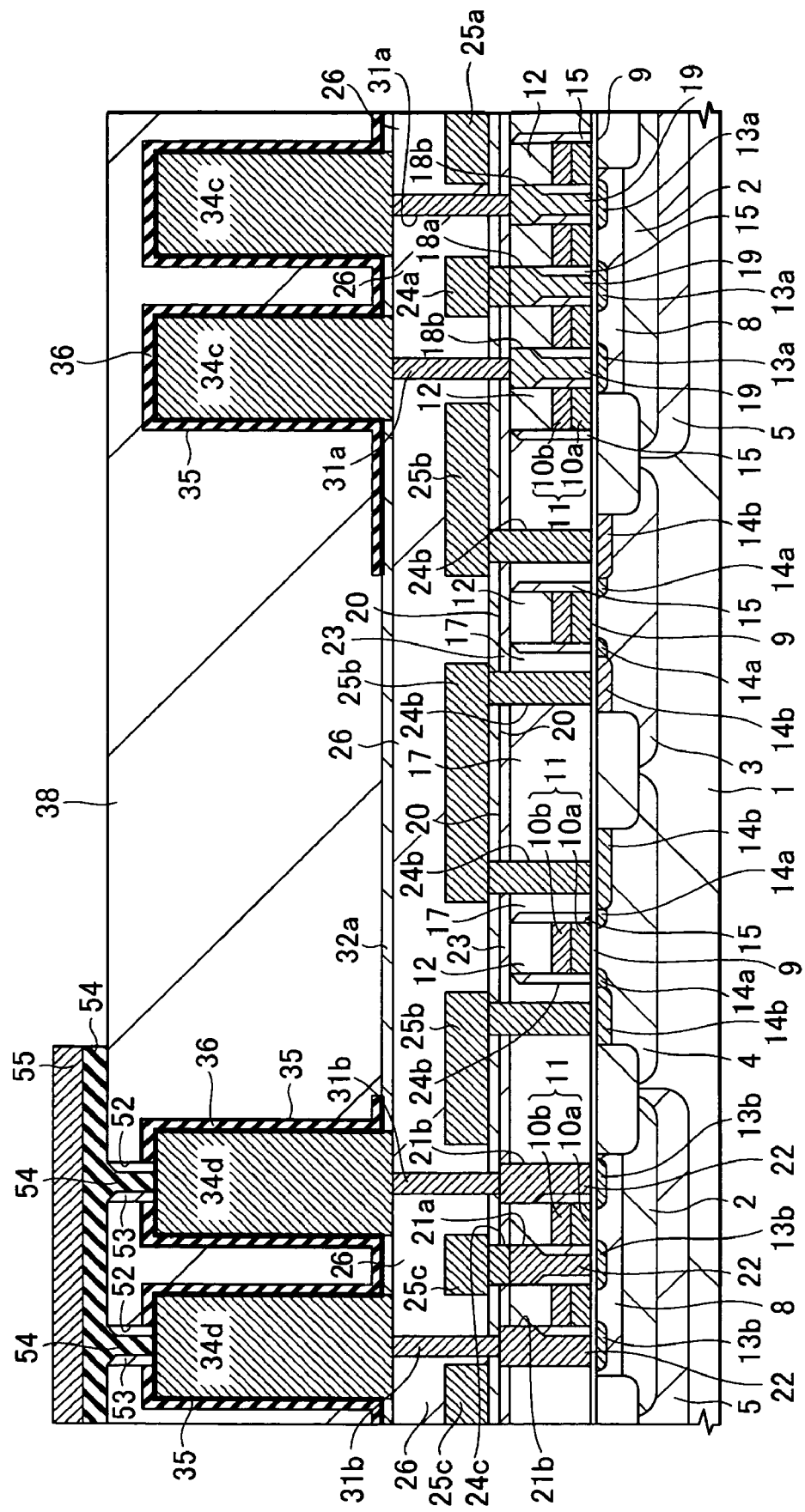
FIG. 24 is a partial cross-sectional view showing the main components of the memory device of the seventh embodiment of the present invention.

FIG. 24 is a partial cross-sectional view showing the main components of the memory device of the seventh embodiment of the present invention. The present embodiment is a modified example of the sixth embodiment described above, and differs in that the chalcogenide film 54 is formed not only inside the connection hole 51, but also on the surface of the interlayer insulation film 38. A chalcogenide element CND such as that shown in FIG. 2A is formed by using photolithography and dry etching to pattern the chalcogenide film 54 together with the upper electrode 55. In the present embodiment as well, since there is no need to directly work the chalcogenide film 54, it is also possible to reduce damage to the chalcogenide film 54.

The present invention is not limited to the embodiments described above, and it is possible to make various modifications within a scope that does not depart from the spirit of the present invention, and such modifications naturally are included in the scope of the present invention.

As described above, in accordance with the memory device of the present invention and the memory device obtained by the manufacturing method of the present invention, the configuration of the memory device is made simple because the complimentary bit line of the DRAM and the bit line of the PCRAM are configured on a shared conductive layer, and a sense amplifier is disposed between the two.

Since the structure of the PCRAM array area and DRAM array area can be made substantially the same, the manufacturing process is not made more complicated. It is thereby possible to fabricate a memory device in which both DRAM and PCRAM are mounted by adding a few processes to the conventional DRAM process. In particular, PCRAM is formed at a lower temperature than the DRAM capacitive layer. Therefore, forming the DRAM capacitive layer after the PCRAM makes it impossible to control the PCRAM crystals in the high-temperature process. However, forming the PCRAM at a lower process temperature after forming the DRAM capacitive layer makes it possible to form PCRAM without degradation in characteristics.

The present invention is particularly advantageously used in semiconductor devices that are used in cases in which both DRAM and PCRAM (nonvolatile memory) are mounted in a plane on the same chip.

What is claimed is:

1. A memory device comprising a DRAM and a phase-change memory (PCRAM) which are formed on a single semiconductor chip,
   the semiconductor chip having a multilayer wiring structure including at least a first wiring layer at a first level and a second wiring layer at a second level different from the first level,
   the DRAM having a DRAM bit line,
   the PCRAM having a PCRAM bit line and a PCRAM source line,
   the DRAM bit line being formed at the first level,
   one of the PCRAM bit line and the PCRAM source line being formed at the first level, and
   the other of the PCRAM bit line and the PCRAM source line being formed at the second level.

2. The memory device as claimed in claim 1, further comprising a sense amplifier electrically connected between the DRAM bit line and the PCRAM bit line,
   the sense amplifier operating in a first mode to amplify data stored in the DRAM and in a second mode to amplify data stored in the PCRAM.

3. The memory device as claimed in claim 1, wherein the PCRAM bit line is formed at the first level and the PCRAM source line is formed at the second level, the first level being lower than the second level, the DRAM further having a capacitor which is formed between the first level and the second level.

4. The memory device as claimed in claim 1, wherein the PCRAM bit line is formed at the first level and the PCRAM source line is formed at the second level, the first level being higher than the second level, the DRAM further having a capacitor which is formed between the first level and the second level.

* * * * *